(12) United States Patent
Yeh et al.

(10) Patent No.: US 9,281,315 B1
(45) Date of Patent: Mar. 8, 2016

(54) MEMORY STRUCTURE AND METHOD FOR MANUFACTURING THE SAME

(71) Applicant: MACRONIX INTERNATIONAL CO., LTD., Hsinchu (TW)

(72) Inventors: Teng-Hao Yeh, Hsinchu (TW); Yen-Hao Shih, New Taipei (TW); Chih-Wei Hu, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/636,261

(22) Filed: Mar. 3, 2015

(51) Int. Cl.
| | |
|---|---|
| *H01L 27/105* | (2006.01) |
| *H01L 29/78* | (2006.01) |
| *H01L 29/417* | (2006.01) |
| *H01L 27/115* | (2006.01) |
| *H01L 23/528* | (2006.01) |
| *H01L 21/8239* | (2006.01) |

(52) U.S. Cl.
CPC ...... *H01L 27/11573* (2013.01); *H01L 21/8239* (2013.01); *H01L 23/5283* (2013.01); *H01L 27/1157* (2013.01); *H01L 27/11578* (2013.01)

(58) Field of Classification Search
CPC .............. H01L 27/11573; H01L 27/1157; H01L 27/11575; H01L 27/11551; H01L 27/11578; H01L 27/11556; H01L 21/8239; H01L 21/8221
See application file for complete search history.

(56) References Cited

U.S. PATENT DOCUMENTS

| | | | | |
|---|---|---|---|---|
| 8,178,861 | B2 * | 5/2012 | Futatsuyama | H01L 27/0688 257/4 |
| 8,378,406 | B2 * | 2/2013 | Katsumata | H01L 27/11573 257/314 |
| 8,941,166 | B2 * | 1/2015 | Chen | H01L 21/0337 257/314 |
| 9,023,701 | B1 * | 5/2015 | Lee | H01L 27/11582 257/324 |
| 2014/0070295 | A1 * | 3/2014 | Fukuda | H01L 27/0733 257/306 |

* cited by examiner

*Primary Examiner* — Dale E Page
*Assistant Examiner* — Paul Budd
(74) *Attorney, Agent, or Firm* — McClure, Qualey & Rodack, LLP

(57) ABSTRACT

A memory structure and a method for manufacturing the same are provided. The memory structure comprises a substrate, stacks, memory layers, a conductive material and conductive lines. The stacks are positioned on the substrate. The stacks are separated from each other by trenches. Each of the stacks comprises alternately stacked conductive stripes and insulating stripes. The memory layers conformally cover the stacks respectively. The conductive material is positioned in the trenches and on the stacks. The conductive material in the trenches forms one or more holes in each of the trenches. The conductive lines are positioned on the conductive material. Each of the conductive lines comprises a first portion and a second portion connected to each other, the first portion extends along a direction perpendicular to an extending direction of the stacks, and the second portion extends along the extending direction of the stacks.

20 Claims, 27 Drawing Sheets

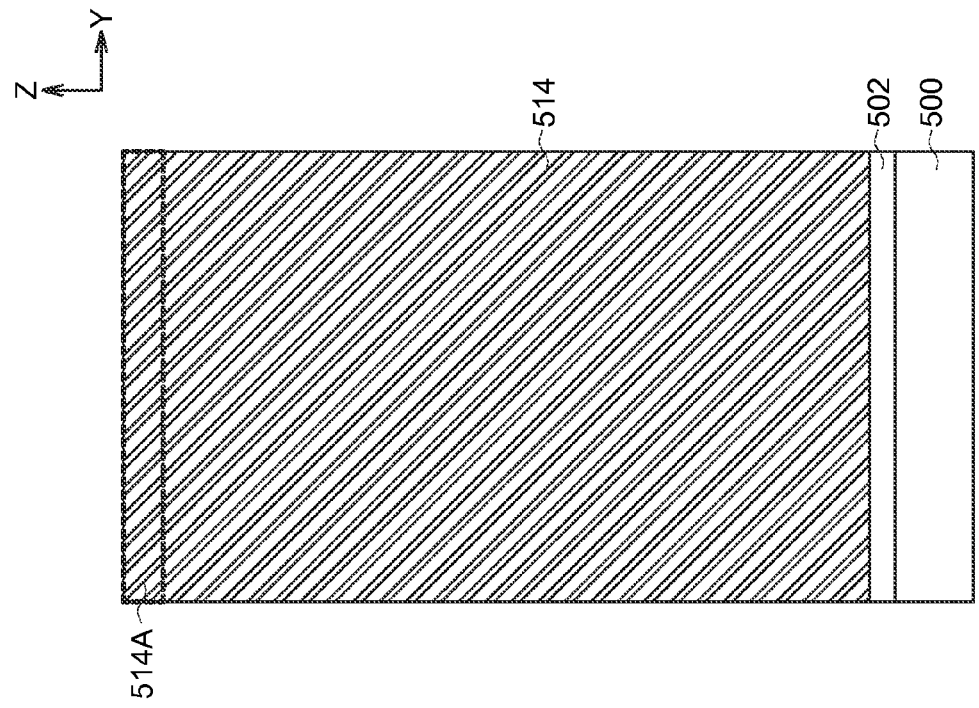
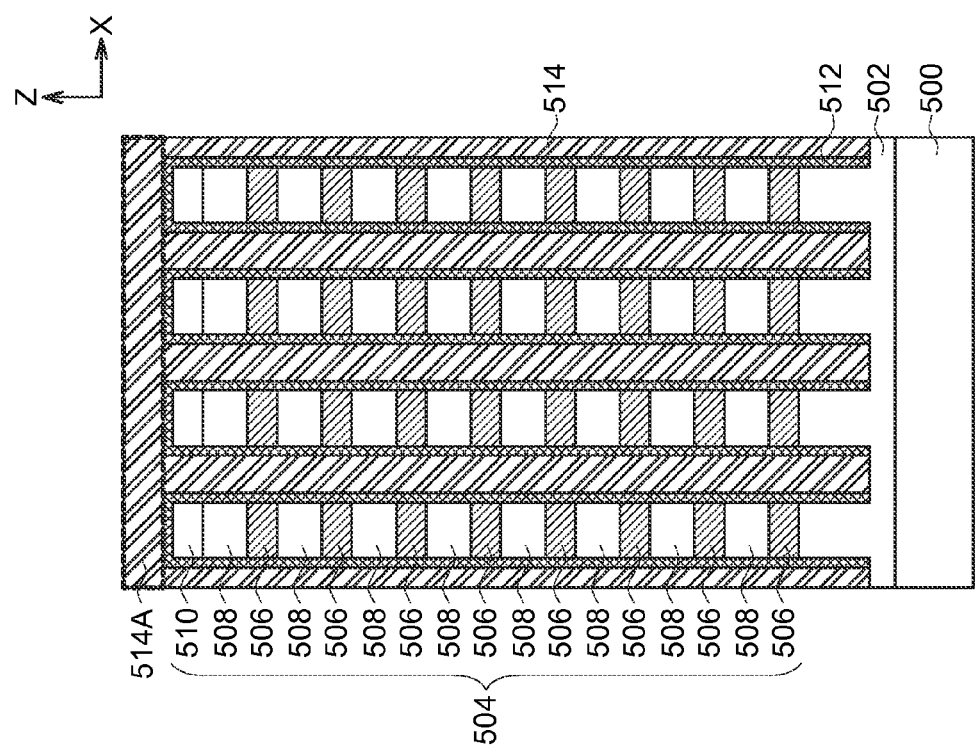

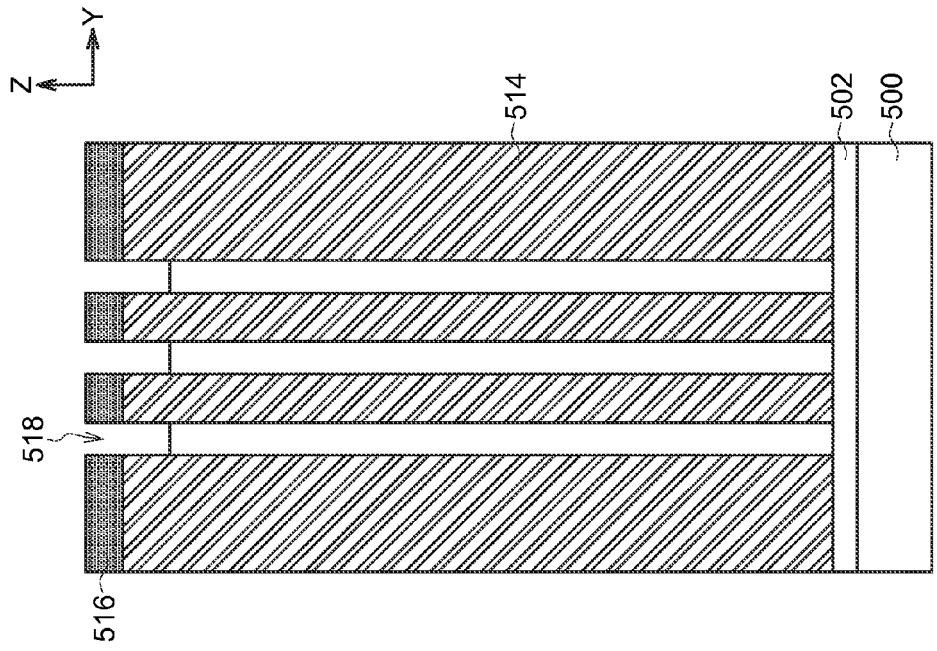
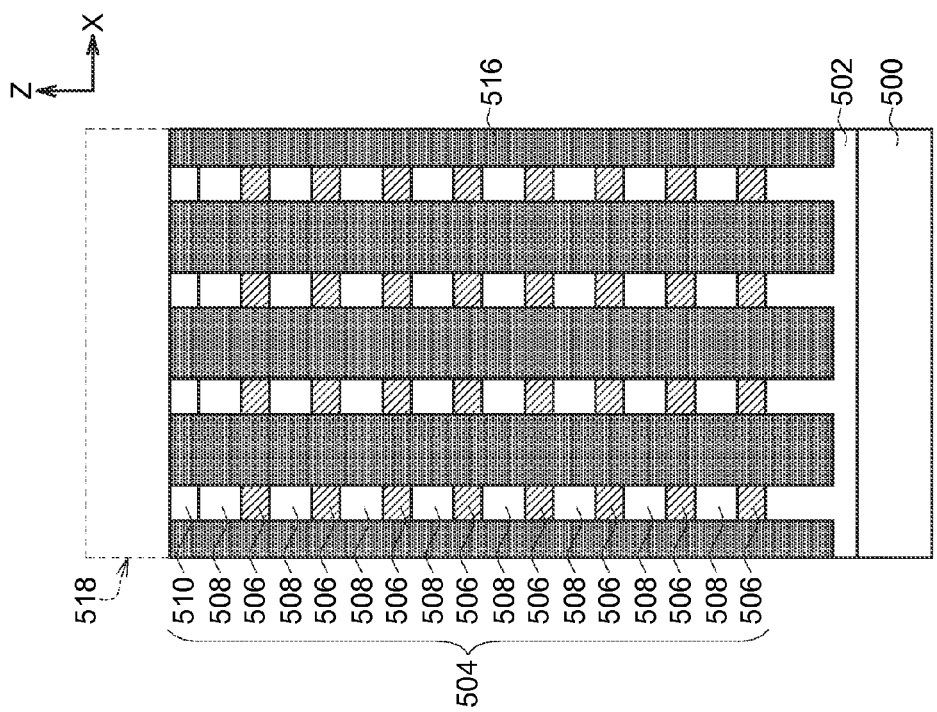

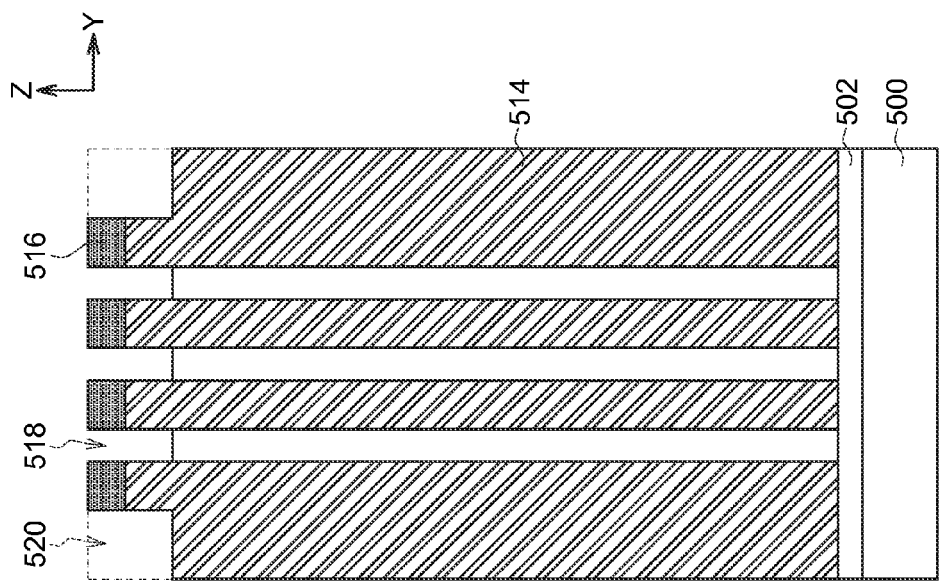
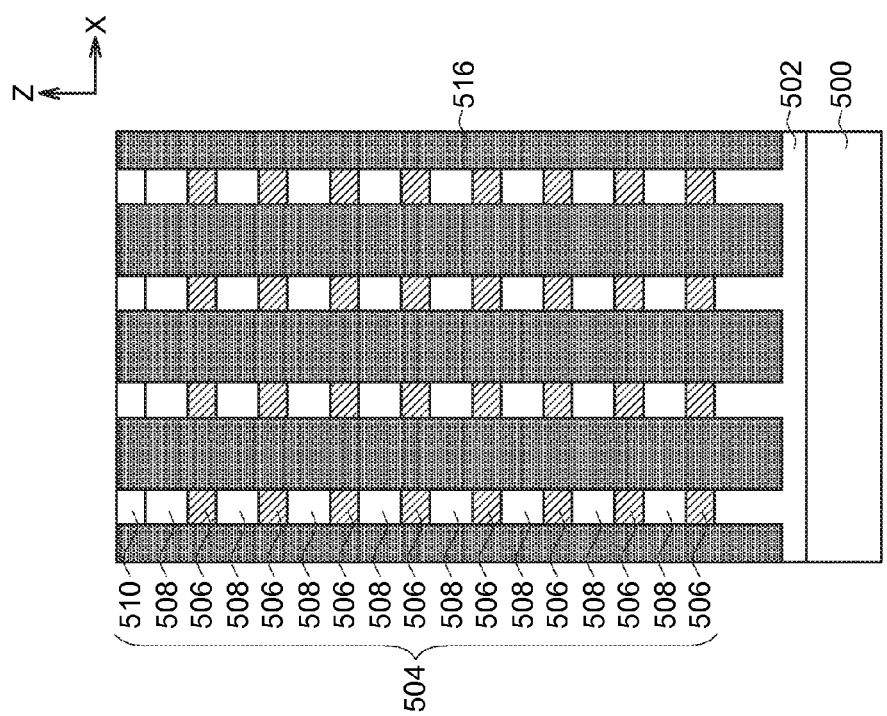

MEMORY STRUCTURE AND METHOD FOR MANUFACTURING THE SAME

TECHNICAL FIELD

This disclosure relates to a semiconductor structure and a method for manufacturing the same. More particularly, this disclosure relates to a memory structure and a method for manufacturing the same.

BACKGROUND

Typically, a memory comprises an array region and a periphery region. The memory cells in the array region are controlled by conductive lines, such as bit lines and word lines. These conductive lines extend from the array region to the periphery region and are connected to decoders in the periphery region. In the array region, the lines can be formed in a regular environment. However, in the region such as near the boundary, the lines must be formed in a more complicate environment. Such a complicate environment may result in a higher failure rate. For example, in a typical case of 3D vertical gate NAND memory, the fan-out portions of word lines are formed outside stacks of bit lines. In other words, the word lines are fabricated across the boundaries of the bit lines. As such, bridges may occur between the word lines due to the unpredictable lithography or etching behavior in the bit line boundary regions.

SUMMARY

In this disclosure, an improved memory structure is provided. The fan-out portions of conductive lines over the stacks are fabricated in a dummy array region, i.e. fabricated on the dummy stacks. As such, the conductive lines are all formed in a relative regular region, and the failure rate can be decreased.

According to some embodiments, a method for manufacturing a memory structure is provided. The method comprises the following steps. First, a plurality of stacks are formed on a substrate. The stacks are separated from each other by a plurality of trenches. Each of the stacks comprises alternately stacked conductive stripes and insulating stripes. A plurality of memory layers are formed conformally covering the stacks respectively. A conductive material is formed in the trenches and on the stacks. The conductive material has a top portion. One or more holes are formed in the conductive material in each of the trenches. A plurality of predetermined regions for respectively forming a plurality of conductive lines are defined in the top portion of the conductive material. Each of the predetermined regions comprises a first predetermined region and a second predetermined region connected to each other, the first predetermined region extends along a direction perpendicular to an extending direction of the stacks, and the second predetermined region extends along the extending direction of the stacks. Then, the top portion of the conductive material that is not in the predetermined regions is removed. The conductive lines are formed on the top portion of the conductive material remained in the predetermined regions.

According to some embodiments, a memory structure is provided. The memory structure comprises a substrate, a plurality of stacks, a plurality of memory layers, a conductive material and a plurality of conductive lines. The stacks are positioned on the substrate. The stacks are separated from each other by a plurality of trenches. Each of the stacks comprises alternately stacked conductive stripes and insulating stripes. The memory layers conformally cover the stacks respectively. The conductive material is positioned in the trenches and on the stacks. The conductive material in the trenches forms one or more holes in each of the trenches. The conductive lines are positioned on the conductive material. Each of the conductive lines comprises a first portion and a second portion connected to each other, the first portion extends along a direction perpendicular to an extending direction of the stacks, and the second portion extends along the extending direction of the stacks.

Figure 1A:
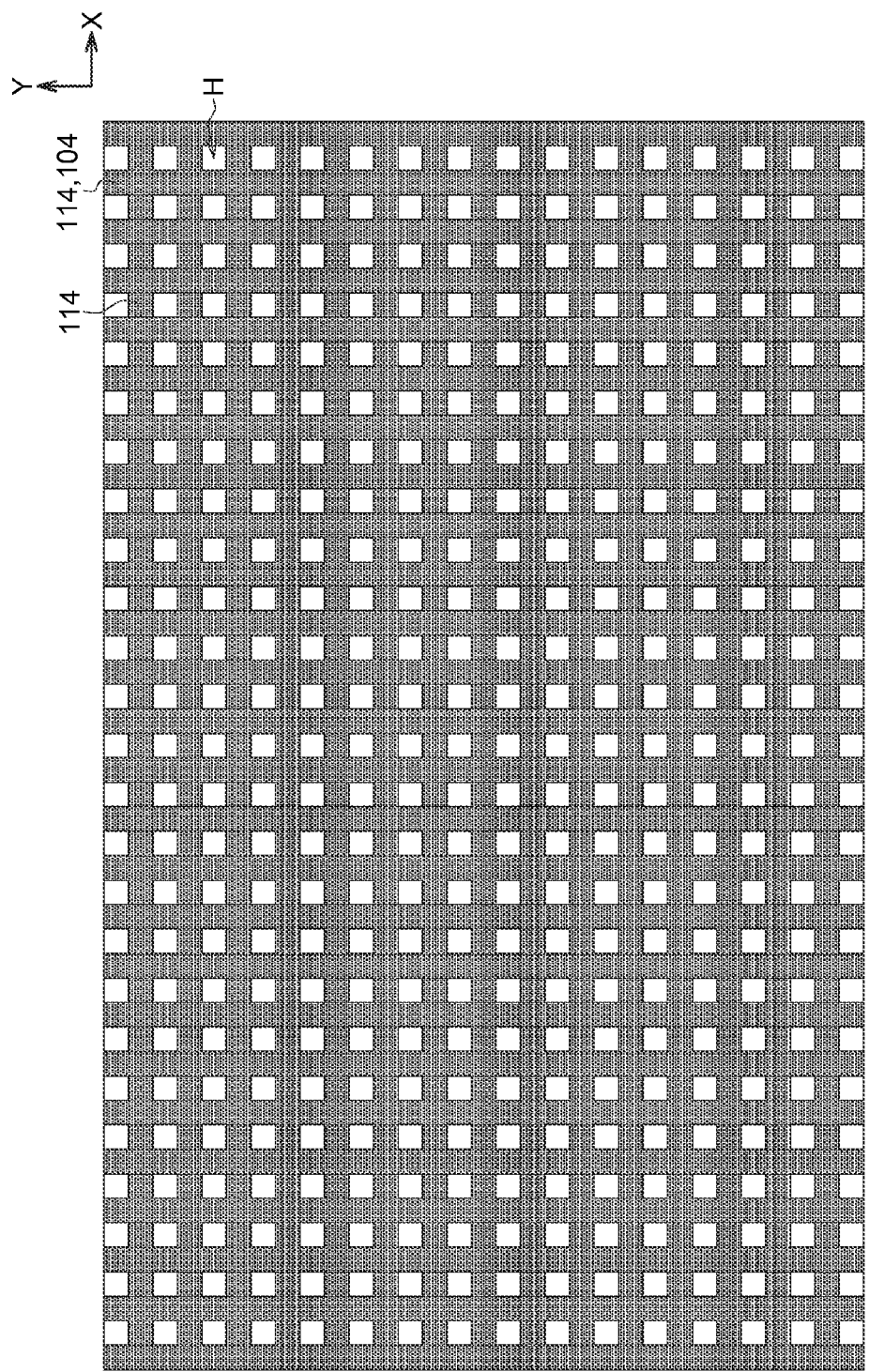
FIGS. 1A-1C show the concept of a method for manufacturing a memory structure method according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now, a method for manufacturing a memory structure is provided here. First, a plurality of stacks are formed on a substrate. The stacks are separated from each other by a plurality of trenches. Each of the stacks comprises alternately stacked conductive stripes and insulating stripes. Next, a plurality of memory layers are formed conformally covering the stacks respectively. Then, a conductive material is formed in the trenches and on the stacks. The conductive material has a top portion at a level higher than the stacks. One or more holes are formed in the conductive material in each of the trenches. An insulating material may be filled into the one or more holes in each of the trenches. Referring to FIG. 1A, the stacks 104, the conductive material 114 and the holes H are shown. In this embodiment, the one or more holes H in each of the trenches are arranged in a matrix.

Figure 1B:
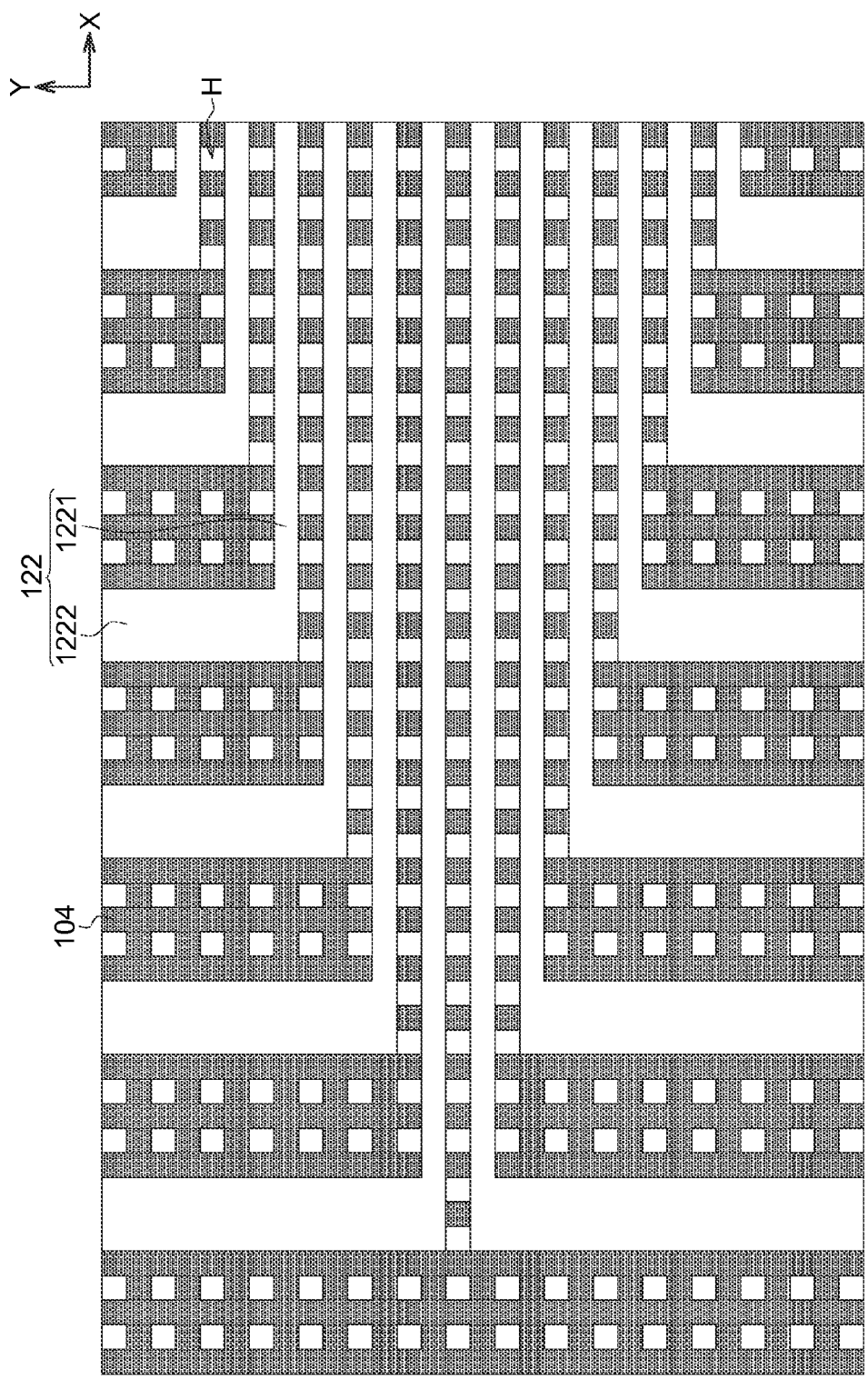

Then, referring to FIG. 1B, a plurality of predetermined regions 122 for respectively forming a plurality of conductive lines are defined in the top portion of the conductive material 114. Each of the predetermined regions 122 comprises a first predetermined region 1221 and a second predetermined region 1222 connected to each other. The first predetermined region 1221 extends along a direction perpendicular to an extending direction of the stacks 104, and the second predetermined region 1222 extends along the extending direction of the stacks 104. In this embodiment, lengths of the first predetermined regions 1221 and the second predetermined regions 1222 are sequentially increased.

Thereafter, the top portion of the conductive material that is not in the predetermined regions may be removed. Then, the conductive lines are formed on the top portion of the conductive material remained in the predetermined regions. The conductive lines may be formed of silicide. The conductive stripes in the stacks may be used as bit lines, and the conductive lines may be used as word lines. Alternatively, the conductive stripes in the stacks may be used as word lines, and the conductive lines may be used as bit lines.

Figure 1C:
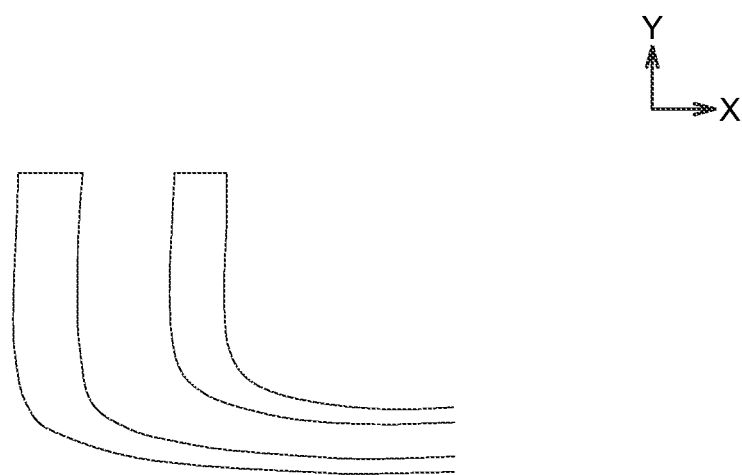

Because of the process limitations, connecting portions of the conductive lines formed by method according to this embodiment may have a curved shape, as shown in FIG. 1C. This configuration is not departed from the scope of this invention, as long as the fan-out portion of the conductive lines can work properly.

Figure 2A:
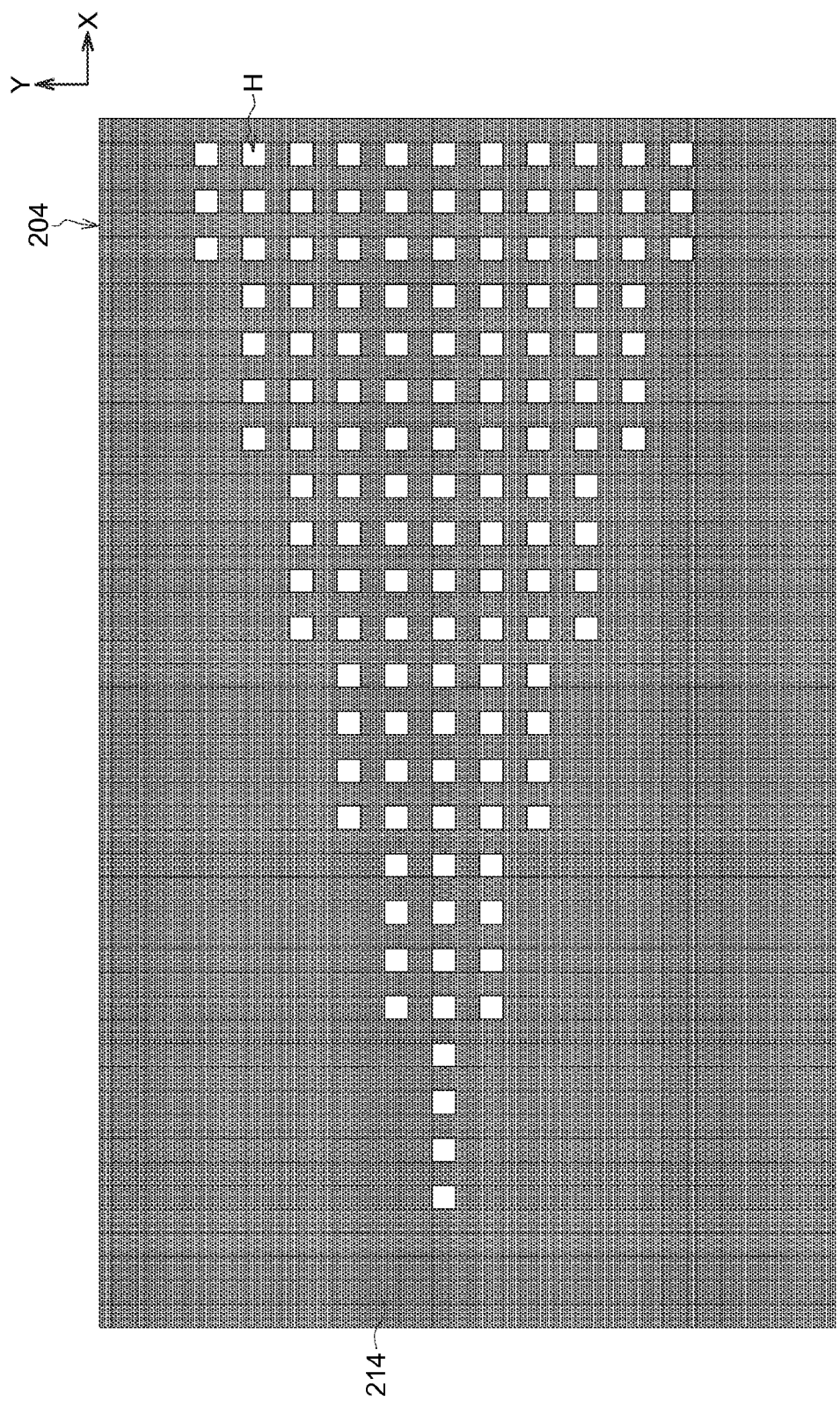
FIGS. 2A-2B show the concept of a method for manufacturing a memory structure method according to one embodiment.

The process described with respect to FIGS. 1A-1C may be instead of by the following process. Referring to FIG. 2A, the stacks 204, the conductive material 214 and the holes H are shown. In this embodiment, the step of defining the predetermined regions for forming conductive lines is carried out before the step of forming the one or more holes H. As such, the holes H may be formed at only positions that the conductive lines are separated by a small spacing (for example, only about 30 nm to about 40 nm). Thus, in this embodiment, the one or more holes H in each of the trenches are arranged to constitute a triangle-like in layout design.

Figure 2B:
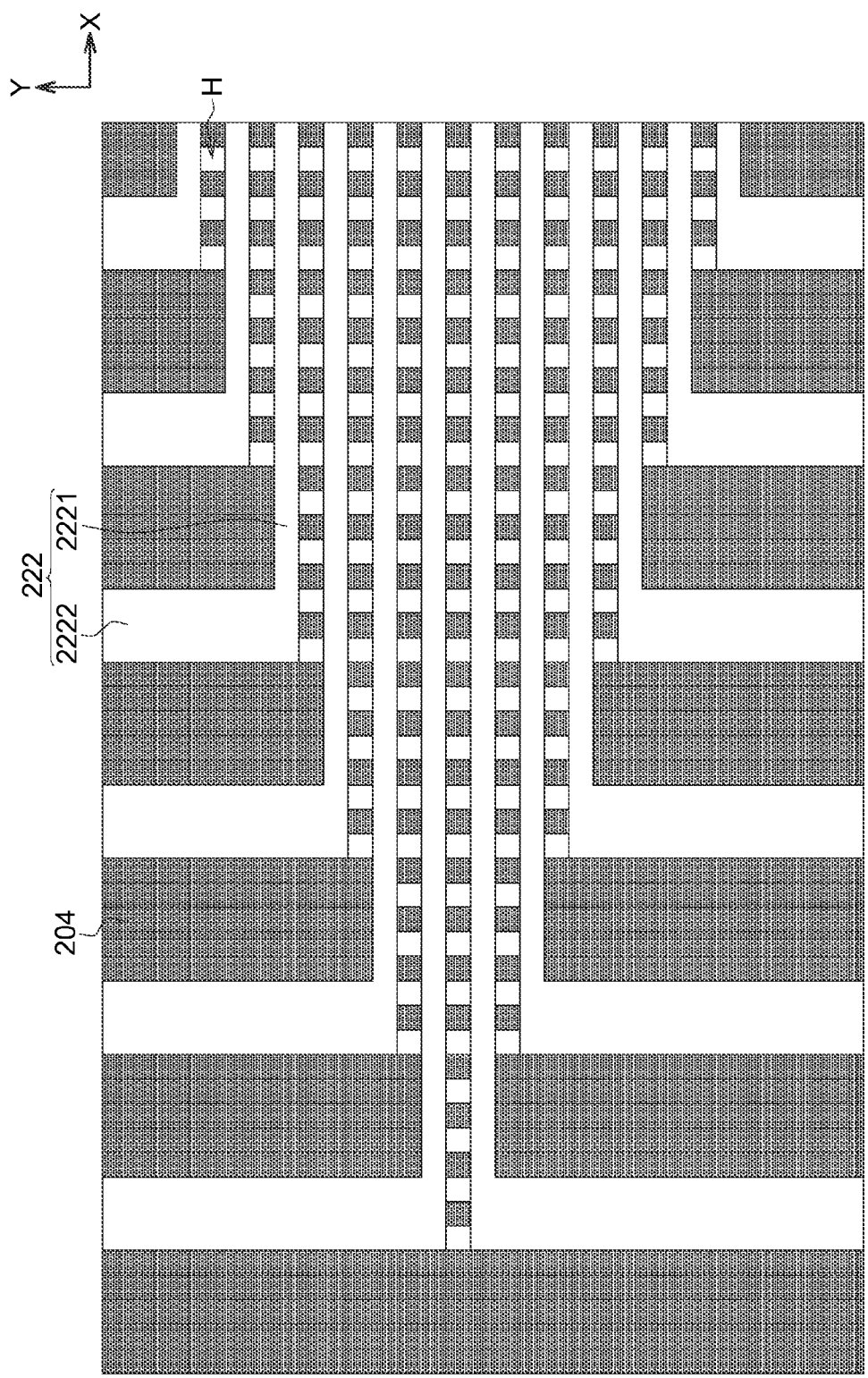

Then, referring to FIG. 2B, a plurality of predetermined regions 222 for respectively forming a plurality of conductive lines are defined in the top portion of the conductive material 214. Each of the predetermined regions 222 comprises a first predetermined region 2221 and a second predetermined region 2222 connected to each other. The first predetermined region 2221 extends along a direction perpendicular to an extending direction of the stacks 204, and the second predetermined region 2222 extends along the extending direction of the stacks 204. In this embodiment, lengths of the first predetermined regions 2221 and the second predetermined regions 2222 are sequentially increased.

Since no holes are formed at positions corresponding to the second predetermined region 2222, the conductive lines manufactured by this embodiment will be stronger than the conductive lines manufactured by the embodiment of FIGS. 1A-1C.

Figure 3A:
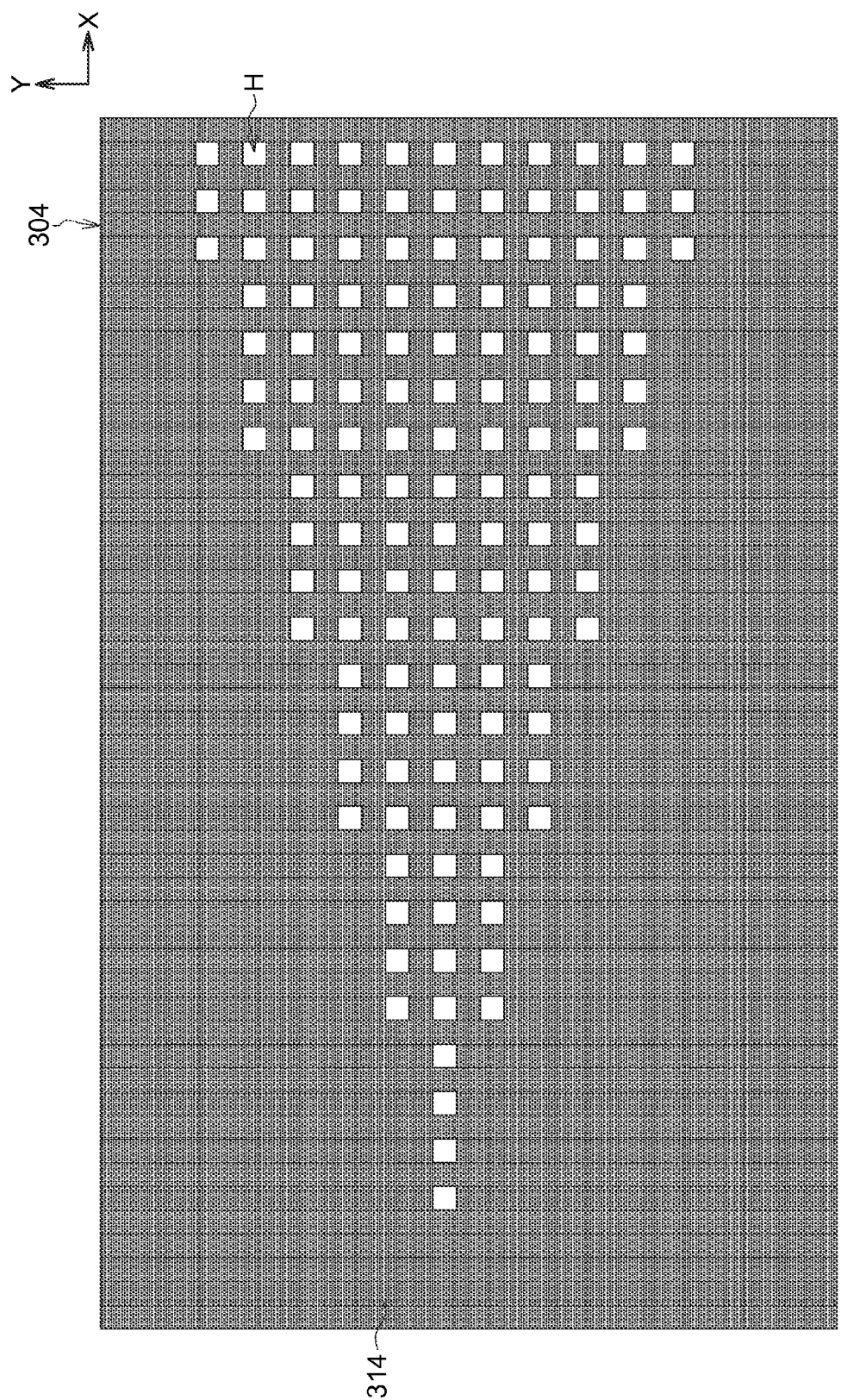
FIGS. 3A-3C show the concept of a method for manufacturing a memory structure method according to one embodiment.

Alternatively, the process describe above may be instead of by the following process. Referring to FIG. 3A, the stacks 304, the conductive material 314 and the holes H are shown. In this embodiment, the holes H are formed at only positions that the conductive lines are separated by a small spacing, and are arranged to constitute a triangle-like in layout design.

Figure 3B:
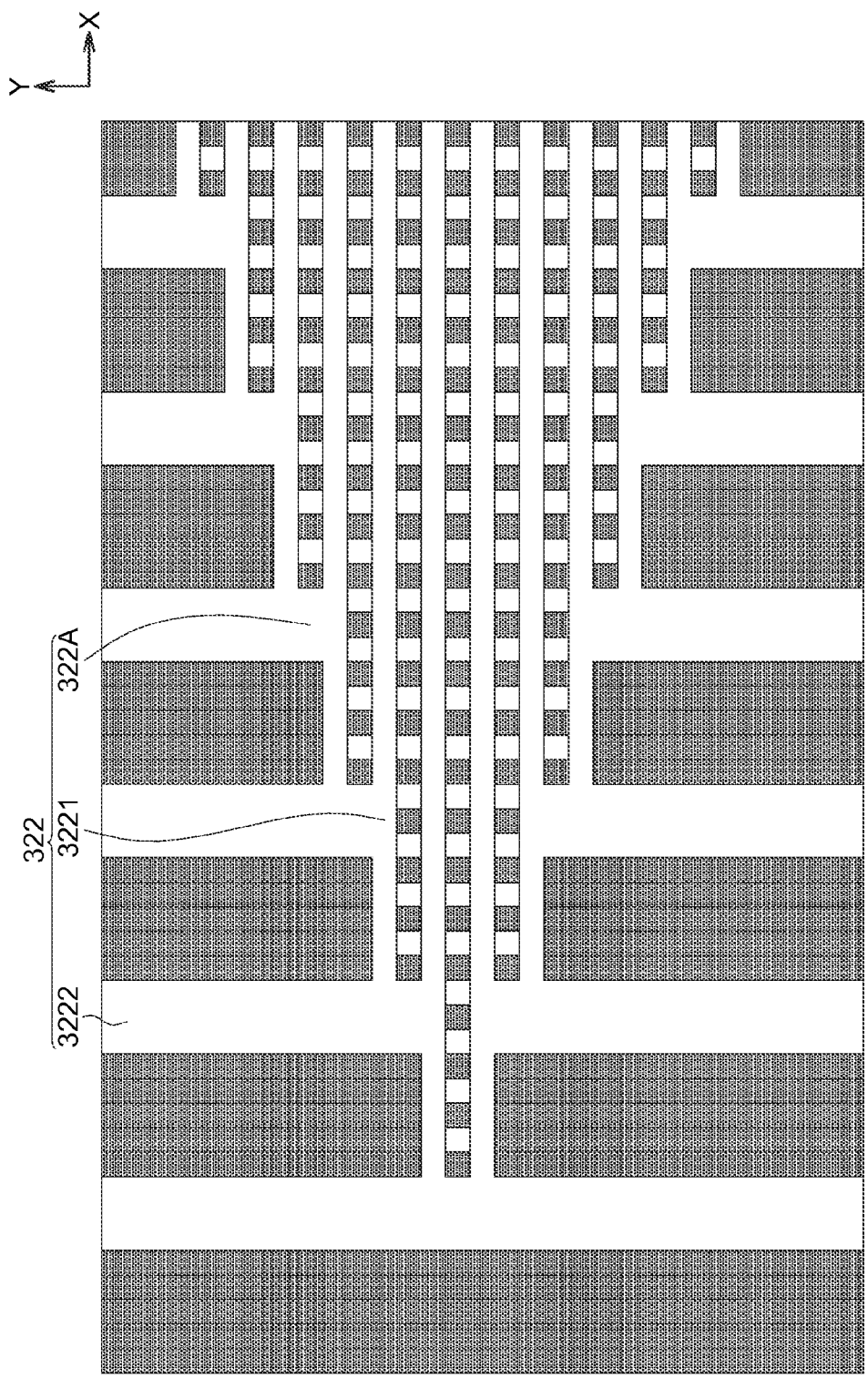

Then, referring to FIG. 3B, a plurality of predetermined regions 322 for respectively forming a plurality of conductive lines are defined in the top portion of the conductive material 314. Each of the predetermined regions 322 comprises a first predetermined region 3221, a second predetermined region 3222 and an extending portion 322A. The first predetermined region 3221 and the second predetermined region 3222 are connected to each other. The first predetermined region 3221 extends along a direction perpendicular to an extending direction of the stacks 304, and the second predetermined region 3222 extends along the extending direction of the stacks 304. The first predetermined regions 3221 of adjacent two of the predetermined regions 322 are connected to each other by the extending portion 322A of the second predetermined region 3222 of one of the adjacent two of the predetermined regions 322. In this embodiment, lengths of the first predetermined regions 3221 and the second predetermined regions 3222 are sequentially increased.

Figure 3C:
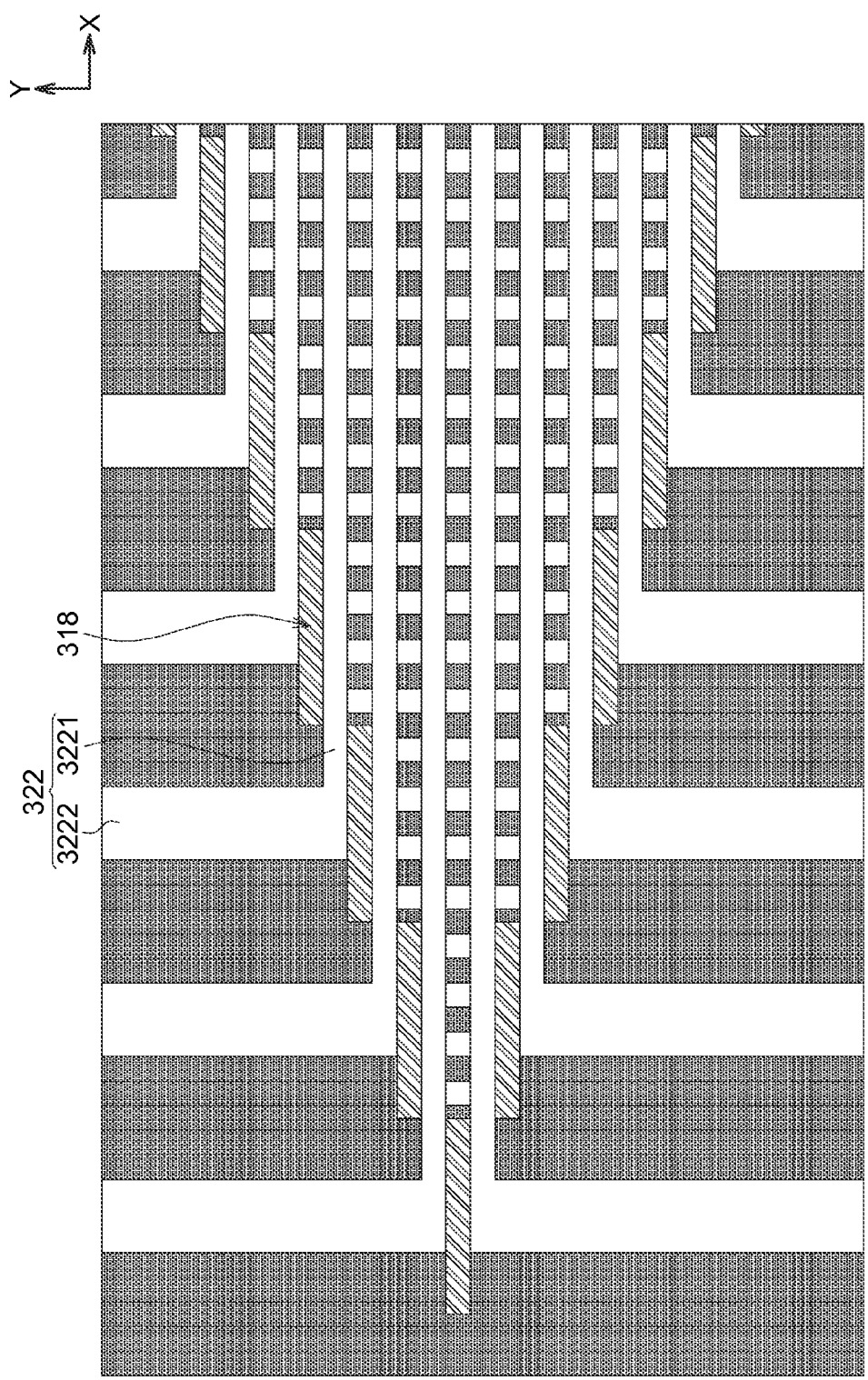

The step of removing the top portion of the conductive material 314 that is not in the predetermined regions 322 comprises a cutting step and a removing step. As shown in FIG. 3C, the cutting step comprises removing portions of the top portion of conductive material 314 and portions of the memory layers on the stacks 304 along the direction perpendicular to the extending direction of the stacks 304. Cut trenches 318 formed by the cutting step are shown. The top portion of the conductive material 314 in the extending portion 322A is removed by the cutting step. The removing step comprises removing remained portions of the top portion of conductive material 314 that is not in the predetermined regions 322.

Since an addition cutting step is used to remove the conductive material 314 in the extending portion 322A near the connecting portion, the formed connecting portion can have a shape closer to a rectangular angle. As such, compared to the conductive lines manufactured by the embodiment of FIGS. 2A-2B, the conductive lines manufactured by this embodiment will be stronger.

Figure 4A:
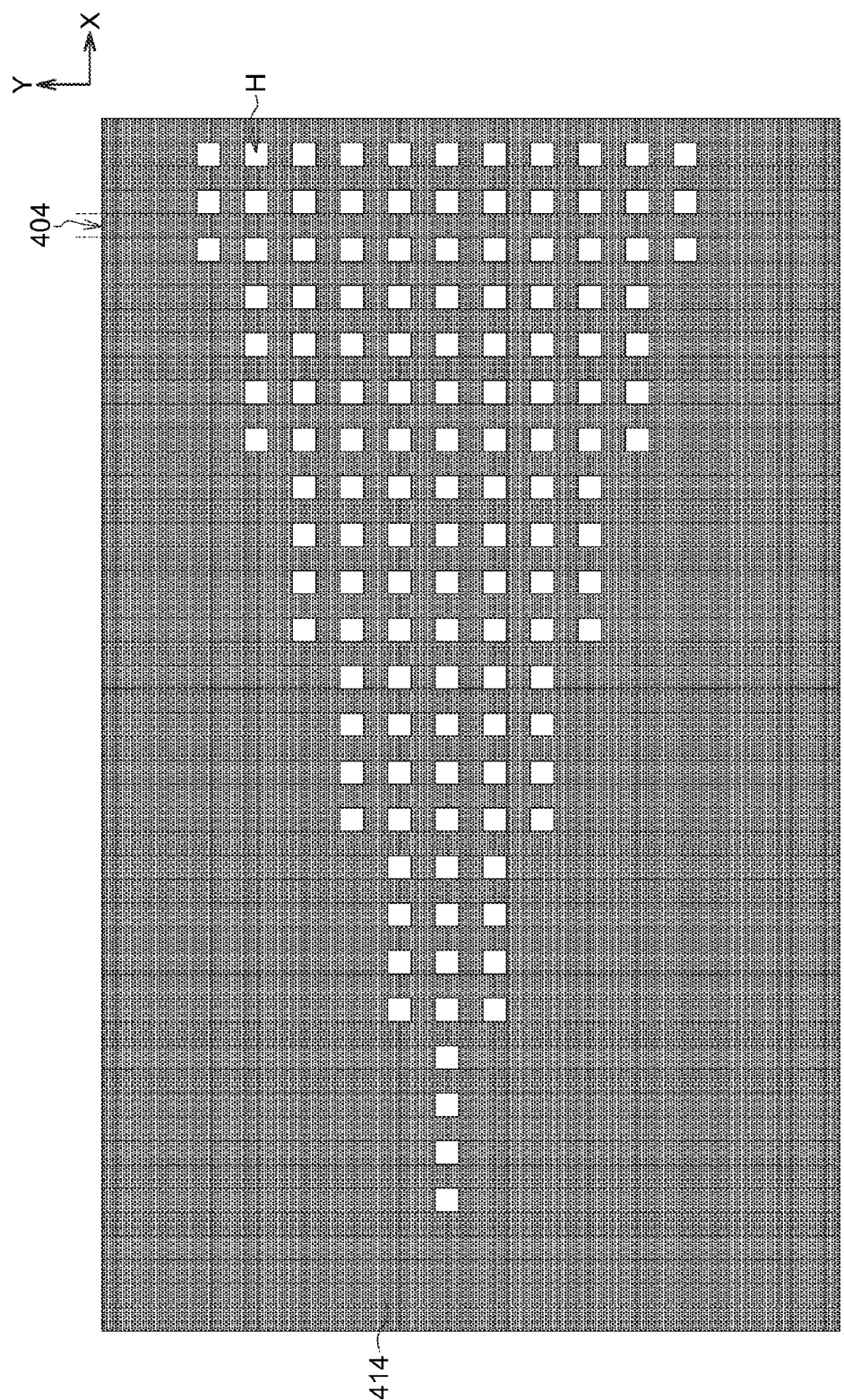
FIGS. 4A-4C show the concept of a method for manufacturing a memory structure method according to one embodiment.

Still alternatively, the process describe above may be instead of by the following process. Referring to FIG. 4A, the stacks 404, the conductive material 414 and the holes H are shown. In this embodiment, the holes H are formed at only positions that the conductive lines are separated by a small spacing, and are arranged to constitute a triangle-like in layout design.

Figure 4B:
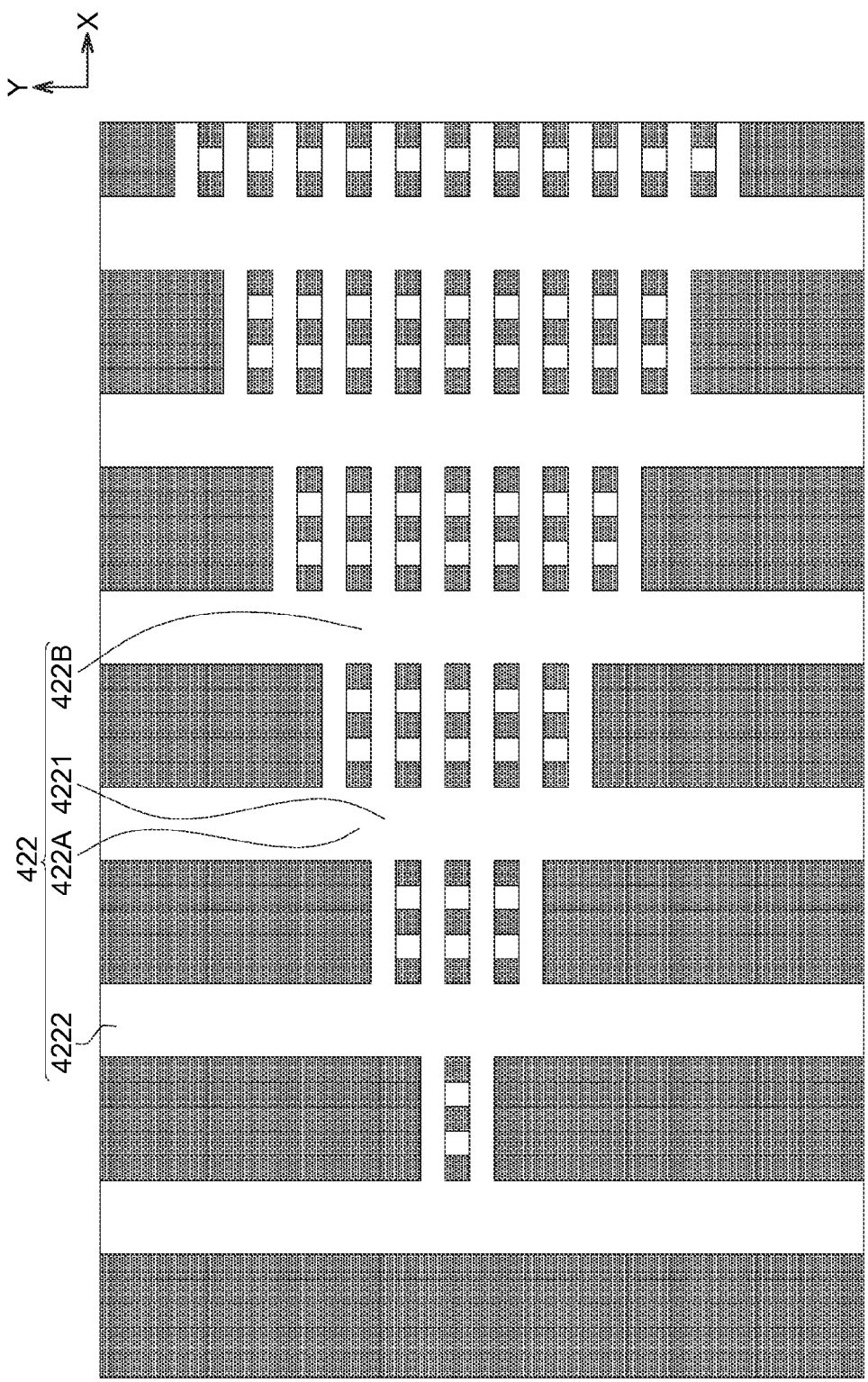

Then, referring to FIG. 4B, a plurality of predetermined regions 422 for respectively forming a plurality of conductive lines are defined in the top portion of the conductive material 414. Each of the predetermined regions 422 comprises a first predetermined region 4221, a second predetermined region 4222 and extending portions 422A and 422B. The first predetermined region 4221 and the second predetermined region 4222 are connected to each other. The first predetermined region 4221 extends along a direction perpendicular to an extending direction of the stacks 404, and the second predetermined region 4222 extends along the extending direction of the stacks 404. The first predetermined regions 4221 of adjacent two of the predetermined regions 422 are connected to each other by an extending portion 422A of the second predetermined region 4222 of one of the adjacent two of the predetermined regions 422 and an extending portion 422B of the second predetermined region 4222 of another one of the predetermined regions 422. In this embodiment, lengths of the first predetermined regions 4221 and the second predetermined regions 4222 are sequentially increased.

Figure 4C:
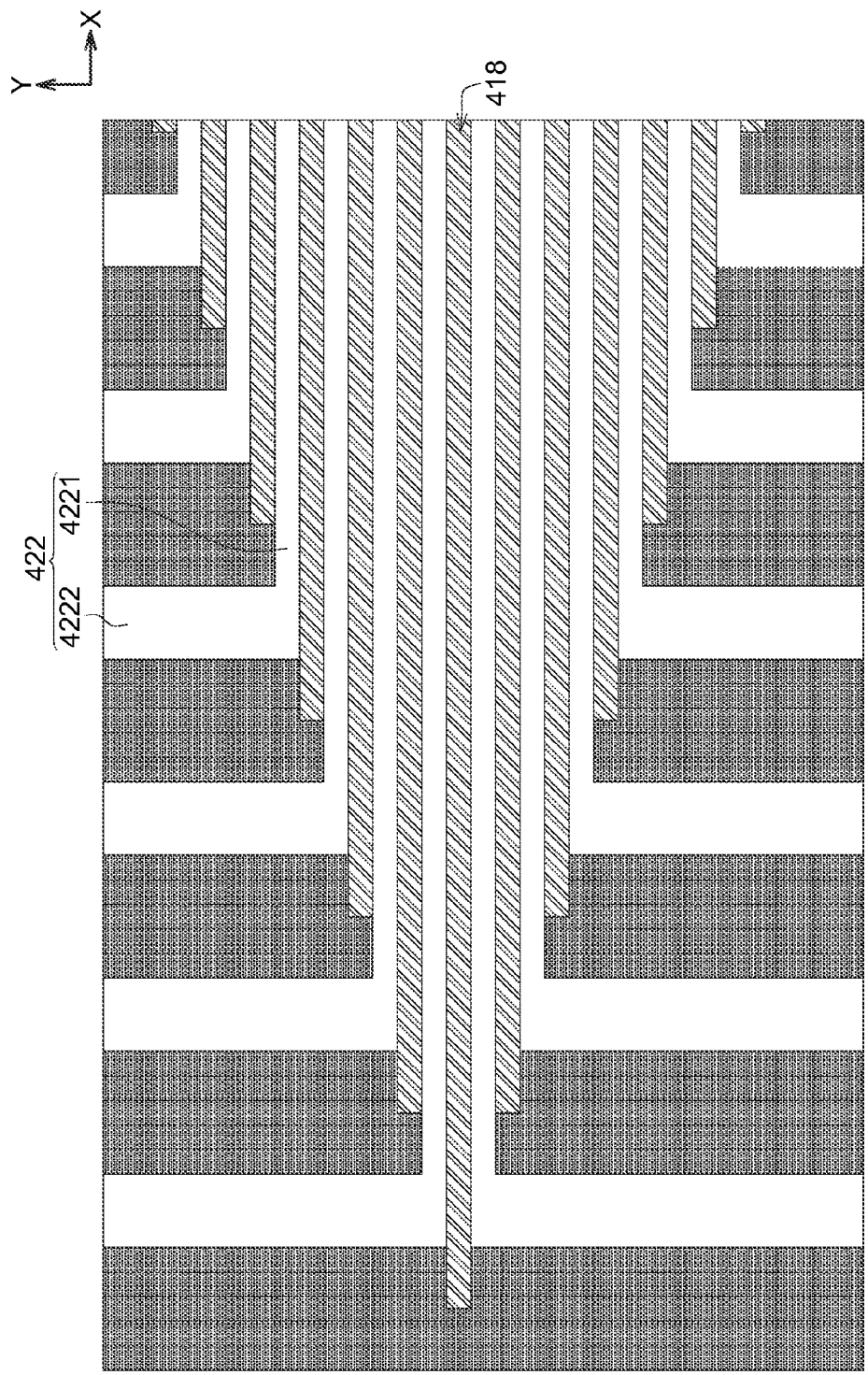

The step of removing the top portion of the conductive material 414 that is not in the predetermined regions 422 comprises a cutting step and a removing step. As shown in FIG. 4C, the cutting step comprises removing portions of the top portion of conductive material 414 and portions of the memory layers on the stacks 404 along the direction perpendicular to the extending direction of the stacks 404. Cut trenches 418 formed by the cutting step are shown. In this embodiment, the cut trenches 418 are formed in a region substantially corresponding to the triangle-like in layout design of the holes H. The top portion of the conductive material 414 in the extending portion 422A of the second predetermined region 4222 of one of the adjacent two of the predetermined regions 422 and in the extending portion 422B of the second predetermined region 4222 of the another one of the predetermined regions 422 is removed by the cutting step. The removing step comprises removing remained portions of the top portion of conductive material 414 that is not in the predetermined regions 422.

Because of a more symmetrical design of the predetermined regions 422, the step of removing the top portion of the conductive material 414 is simpler than the step of removing the top portion of the conductive material 314. As such, a process window can be further enlarged according to this embodiment.

Other processes may be adapted to instead of the process described above with respect to FIG. 1A-1C, 2A-2B, 3A-3C or 4A-4C. For example, in one embodiment, the holes may be arranged as in the embodiment of FIGS. 1A-1C, and the predetermined regions may be defined as in the embodiment of FIGS. 3A-3C. In another embodiment, the holes may be arranged as in the embodiment of FIGS. 1A-1C, and the predetermined regions may be defined as in the embodiment of FIGS. 4A-4C.

For a further understanding of the method for manufacturing a memory structure, an exemplary embodiment is now given with reference to FIGS. 5A-12C. The figures identified by "B" and "C" are cross-sections taken along line 1-1' and line 2-2' in the figures identified "A", respectively. This exemplary embodiment relates to the manufacture of a memory structure as described with respect to FIGS. 4A-4C.

Figure 5A:
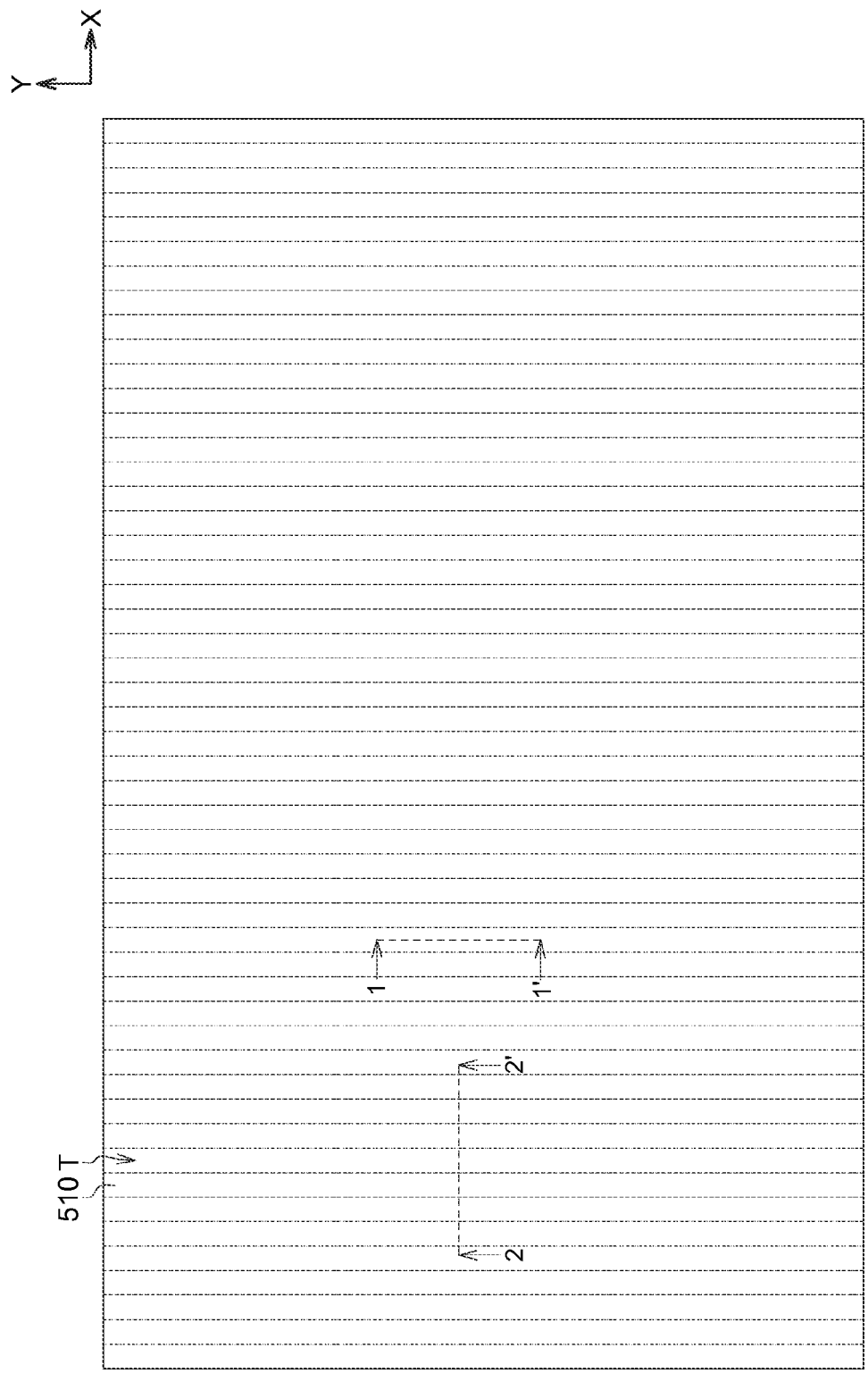
FIGS. 5A-12B show a method for manufacturing a memory structure method according to one exemplary embodiment.
Figure 5B:
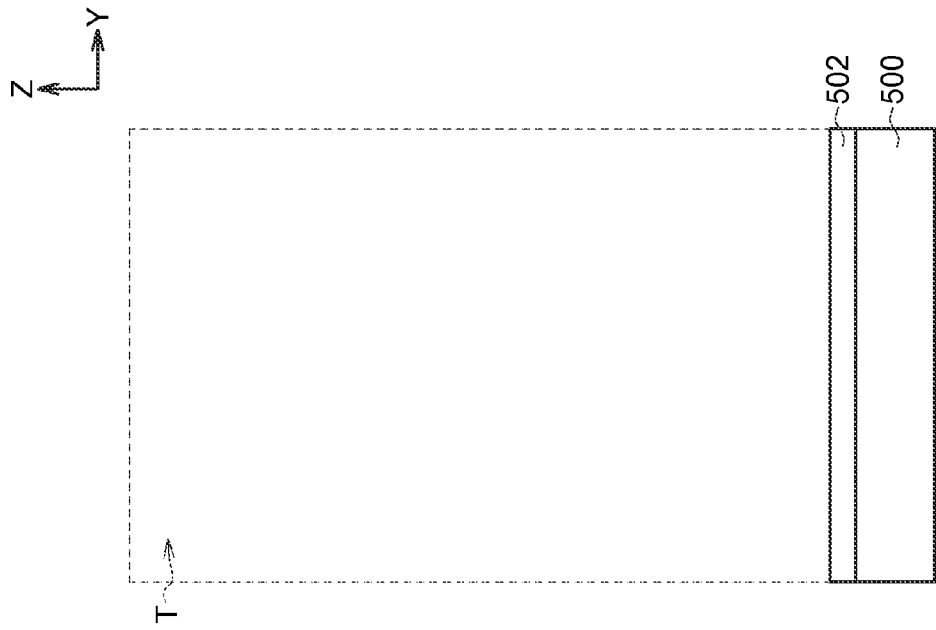
Figure 5C:
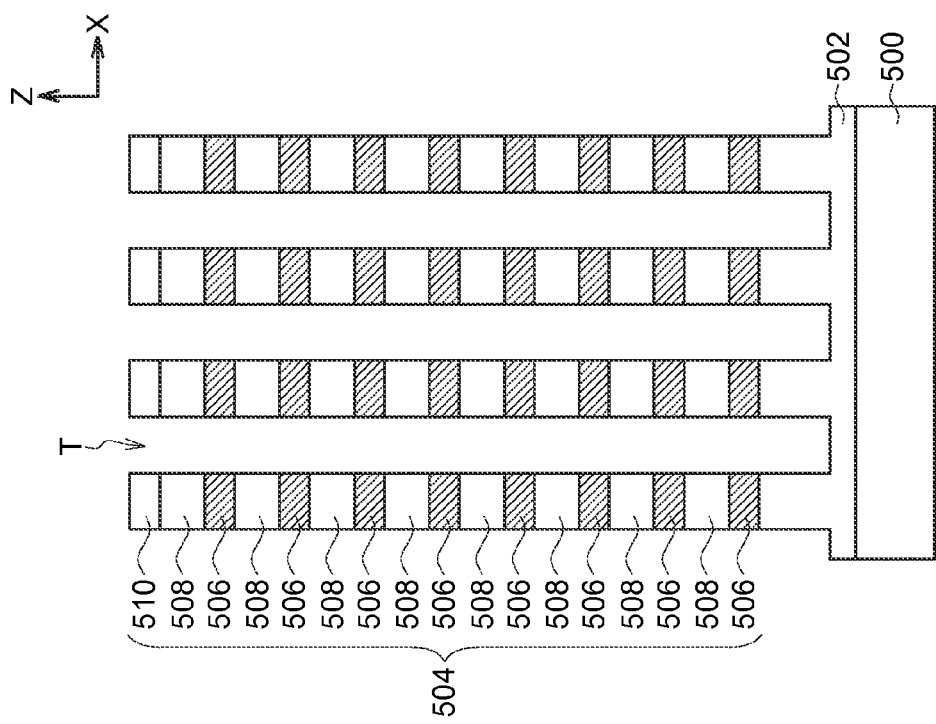

Referring to FIGS. 5A-5C, a plurality of stacks 504 are formed on a substrate 500. In one embodiment, a buried layer 502 is formed on the substrate 500, and the stacks 504 are formed on the buried layer 502. The buried layer 502 may be formed of oxide. The stacks 504 are separated from each other by a plurality of trenches T. Each of the stacks 504 comprises alternately stacked conductive stripes 506 and insulating stripes 508. The conductive stripes 506 may be formed of polysilicon, and the insulating stripes 508 may be formed of oxide. Each of the stacks 504 may further comprise an oxide layer 510 on the conductive stripes 506 and the insulating stripes 508.

Figure 6A:
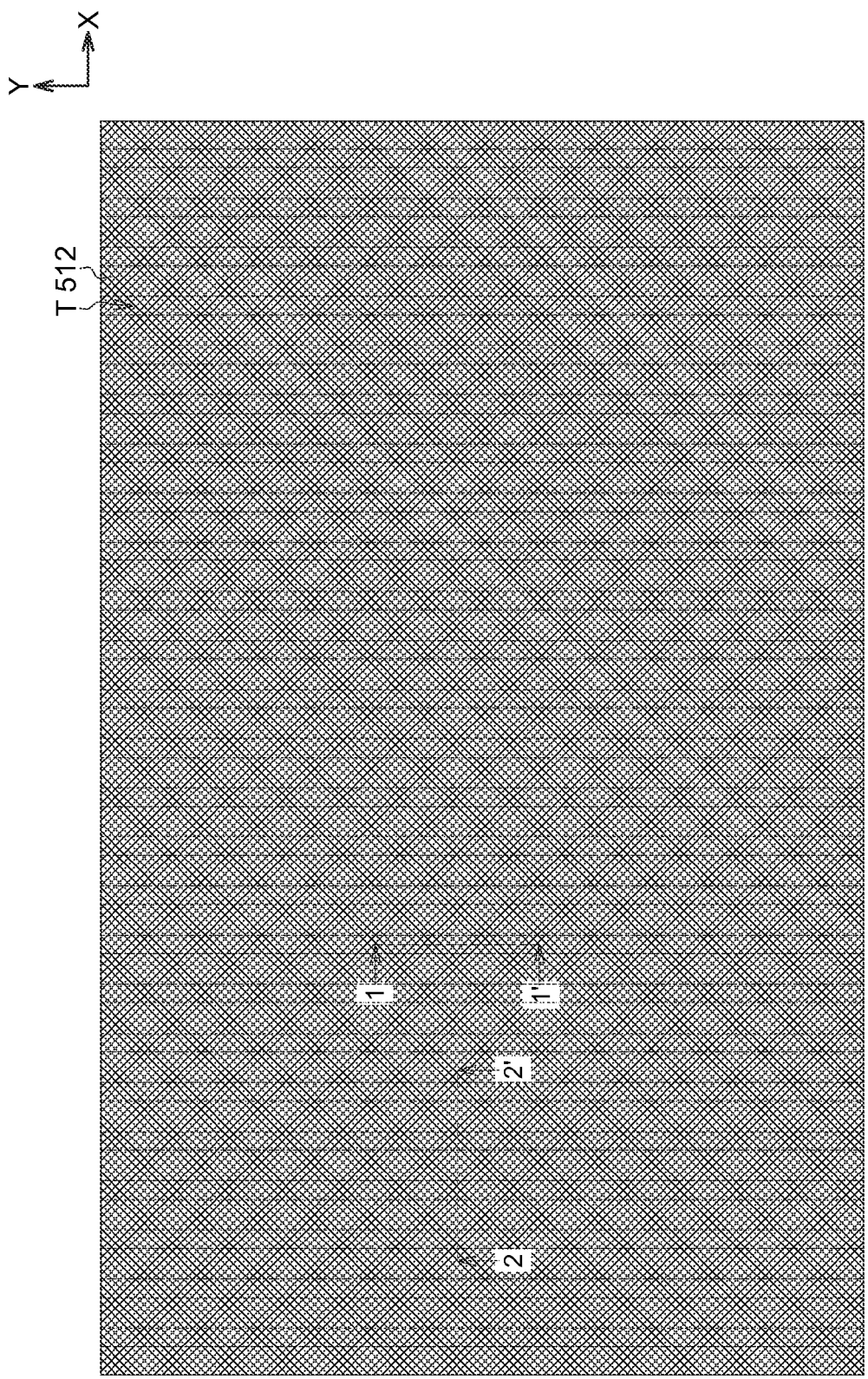
Figure 6B:
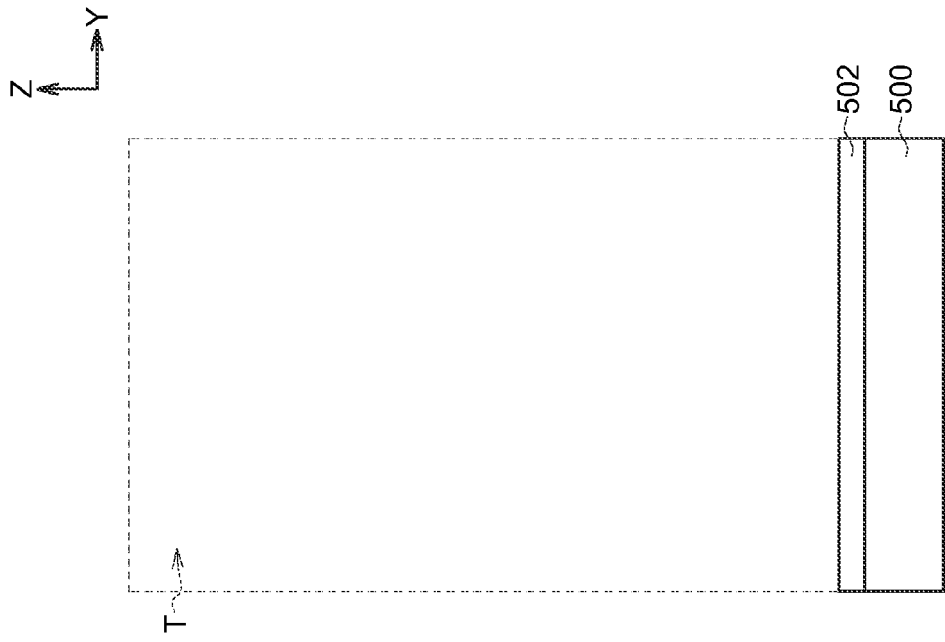
Figure 6C:
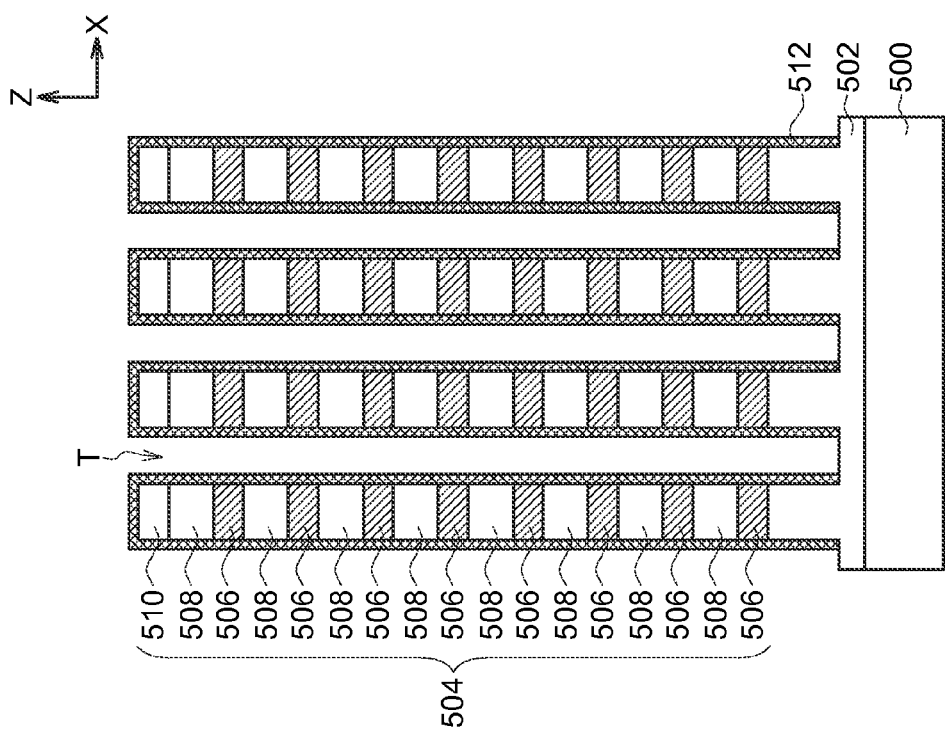

Referring to FIGS. 6A-6C, a plurality of memory layers 512 are formed conformally covering the stacks 504 respectively. The memory layers 512 may be oxide-nitride-oxide (ONO) structures or the like.

Figure 7A:
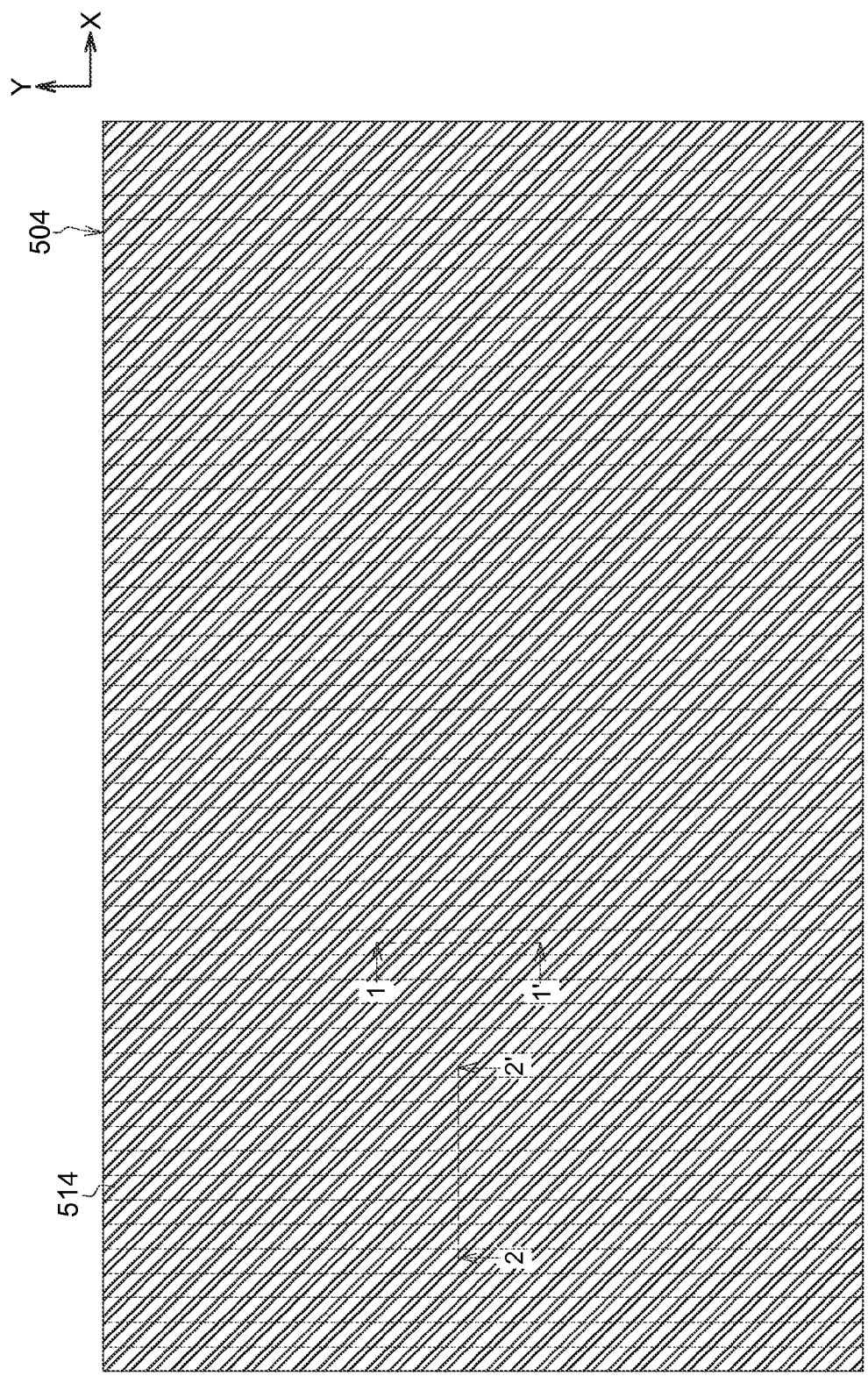

Referring to FIGS. 7A-7C, a conductive material 514 is formed in the trenches T and on the stacks 504. The conductive material 514 has a top portion 514A. Here, the top portion 514A is defined as the portion of the conductive material 514 at a level higher than the stacks 504 and the memory layers 512 on the stacks 504. The conductive material 514 may be polysilicon.

Figure 8A:
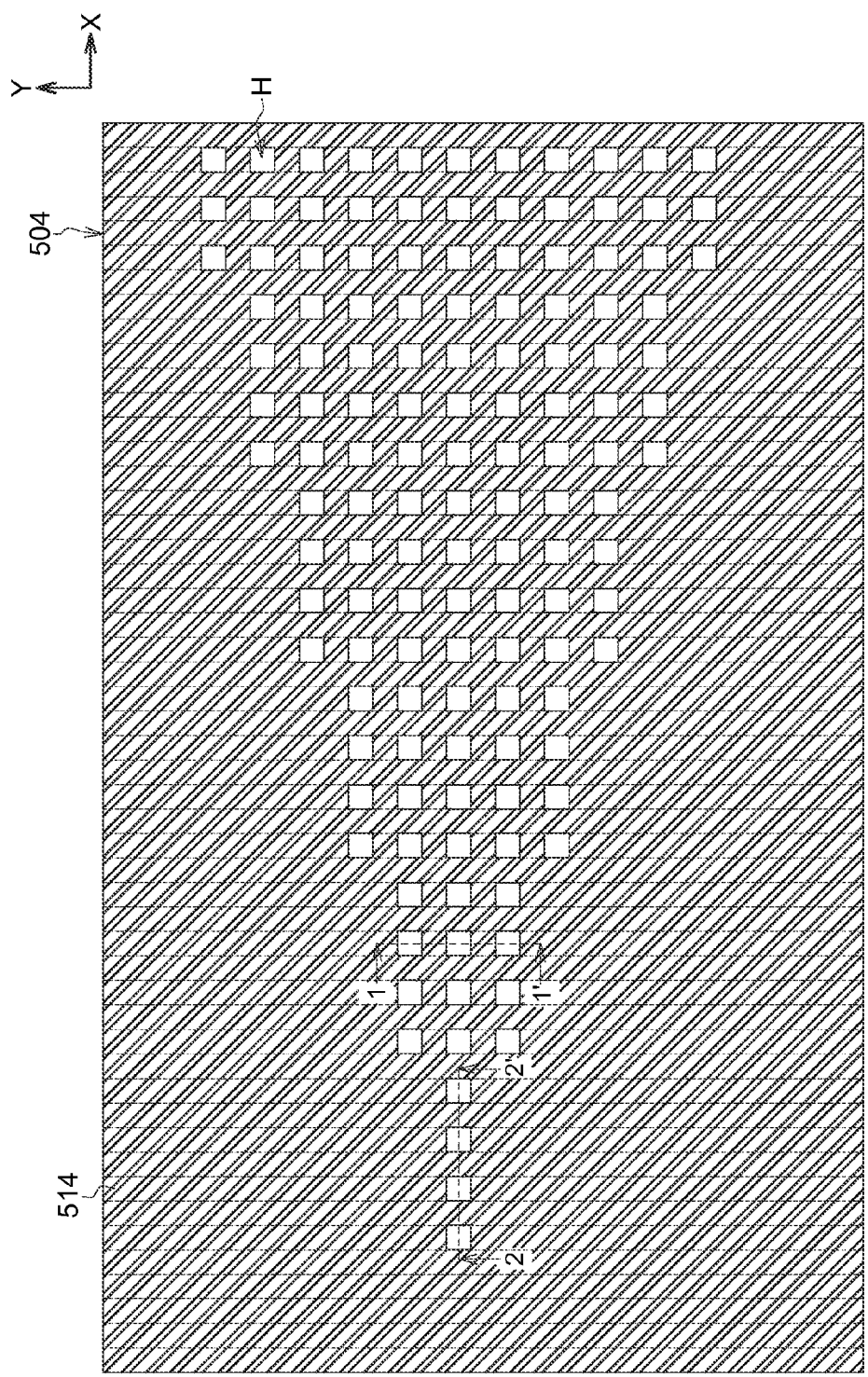
Figure 8B:
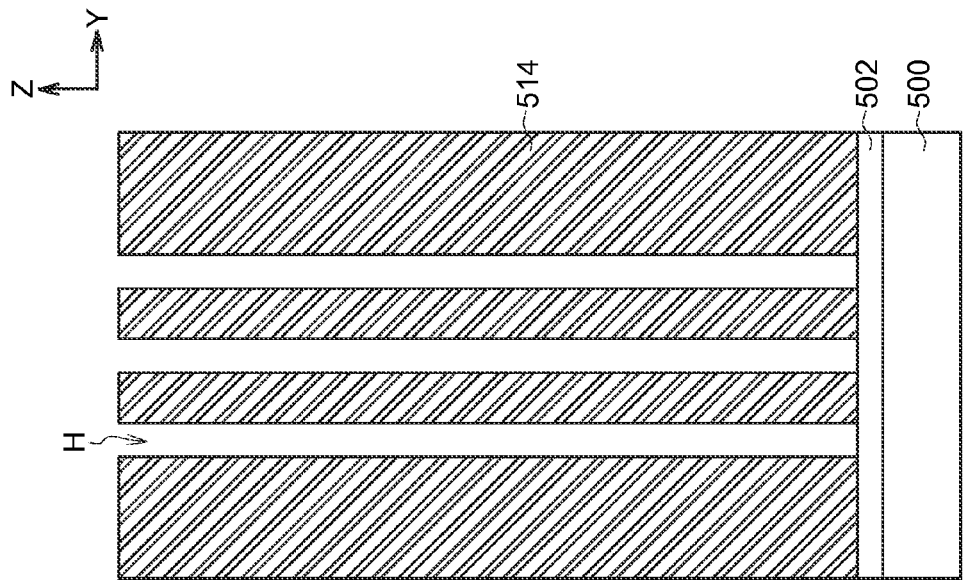
Figure 8C:
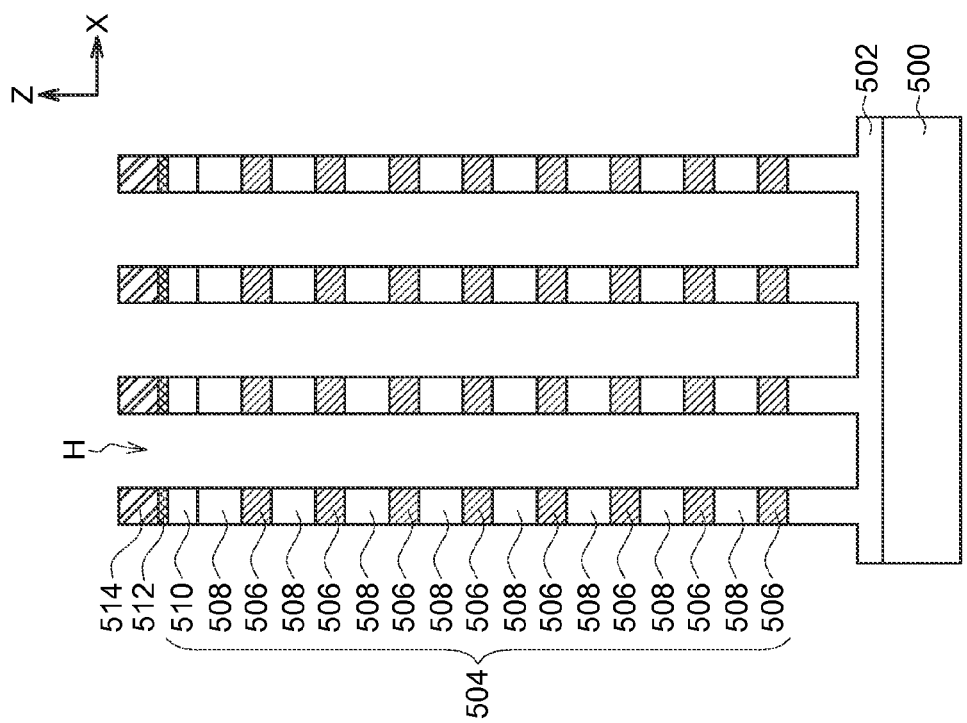

Referring to FIGS. 8A-8C, one or more holes H are formed in the conductive material 514 in each of the trenches T. A step of defining predetermined regions 522 (shown in FIG. 11A) for forming conductive lines 524 (shown in FIG. 12A) may be carried out before the step of forming the one or more holes H, after the step of forming the one or more holes H, or be carried out at any suitable time. Alternatively, the defining step may be carried out several times. For example, the defining step may be carried out at this time. As such, the holes H may be formed at only positions that the conductive lines 524 are separated by a small spacing. The holes H may be formed by lithography and etching processes. In the step of forming the holes H, the memory layers 512 on sidewalls of the stacks 504 in the holes H may be removed.

Figure 9A:
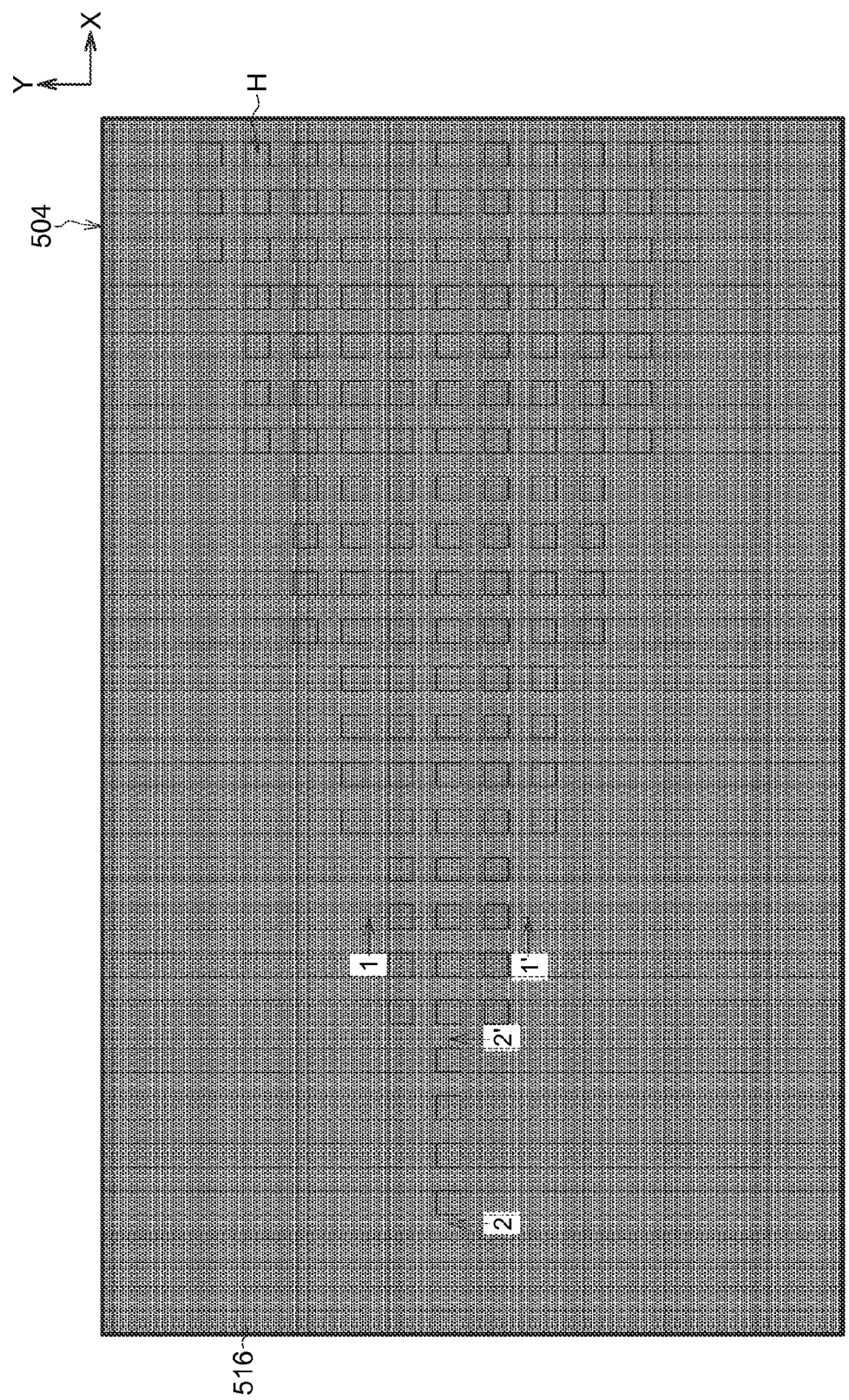
Figure 9B:
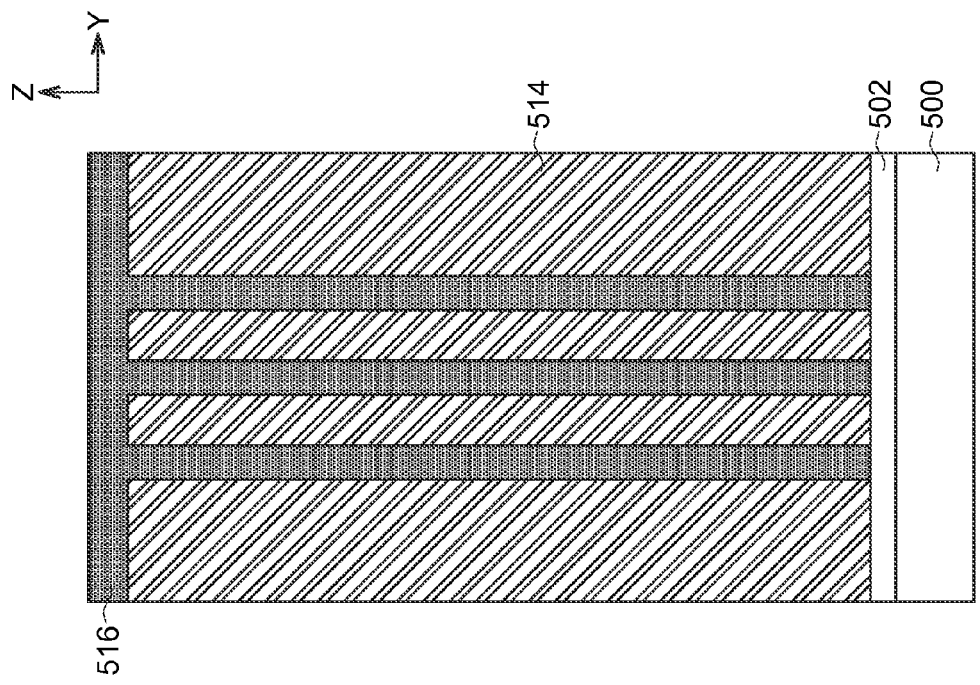
Figure 9C:
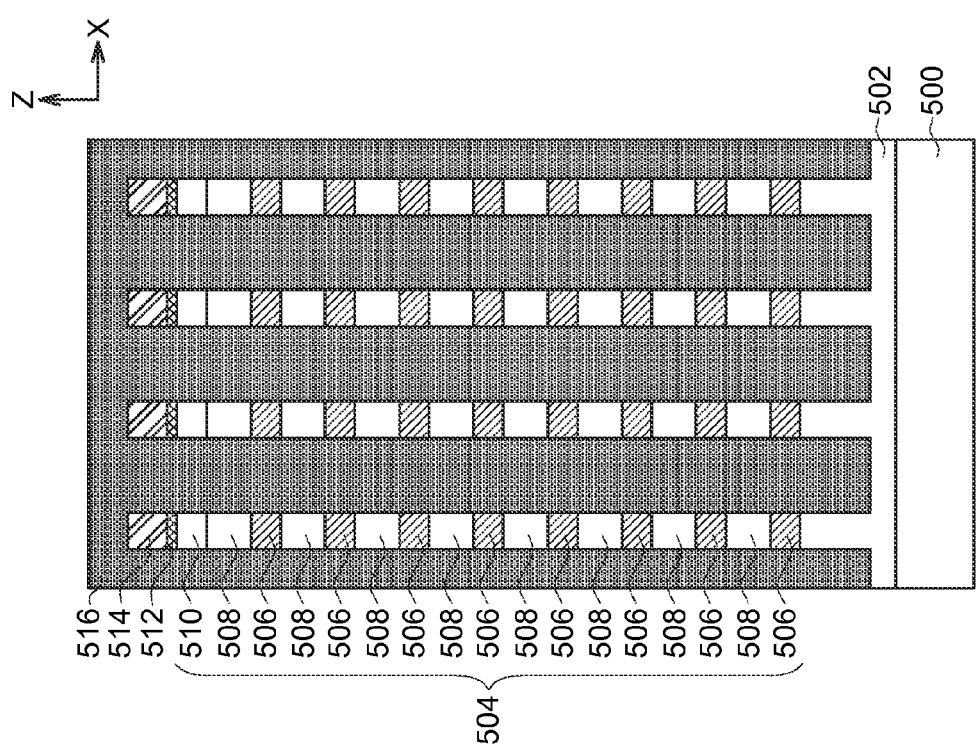

Referring to FIGS. 9A-9C, an insulating material 516 may be filled into the one or more holes H in each of the trenches T. The insulating material 516 may cover the top portion 514A of the conductive material 514, as shown in FIGS. 9B and 9C. The insulating material 516 may be oxide.

Then, the top portion 514A of the conductive material 514 that is not in the predetermined regions 522 (shown in FIG. 11A) for forming conductive lines 524 (shown in FIG. 12A) is removed. The step of removing the top portion 514A of the conductive material 514 that is not in the predetermined regions 522 comprises a cutting step and a removing step.

Figure 10A:
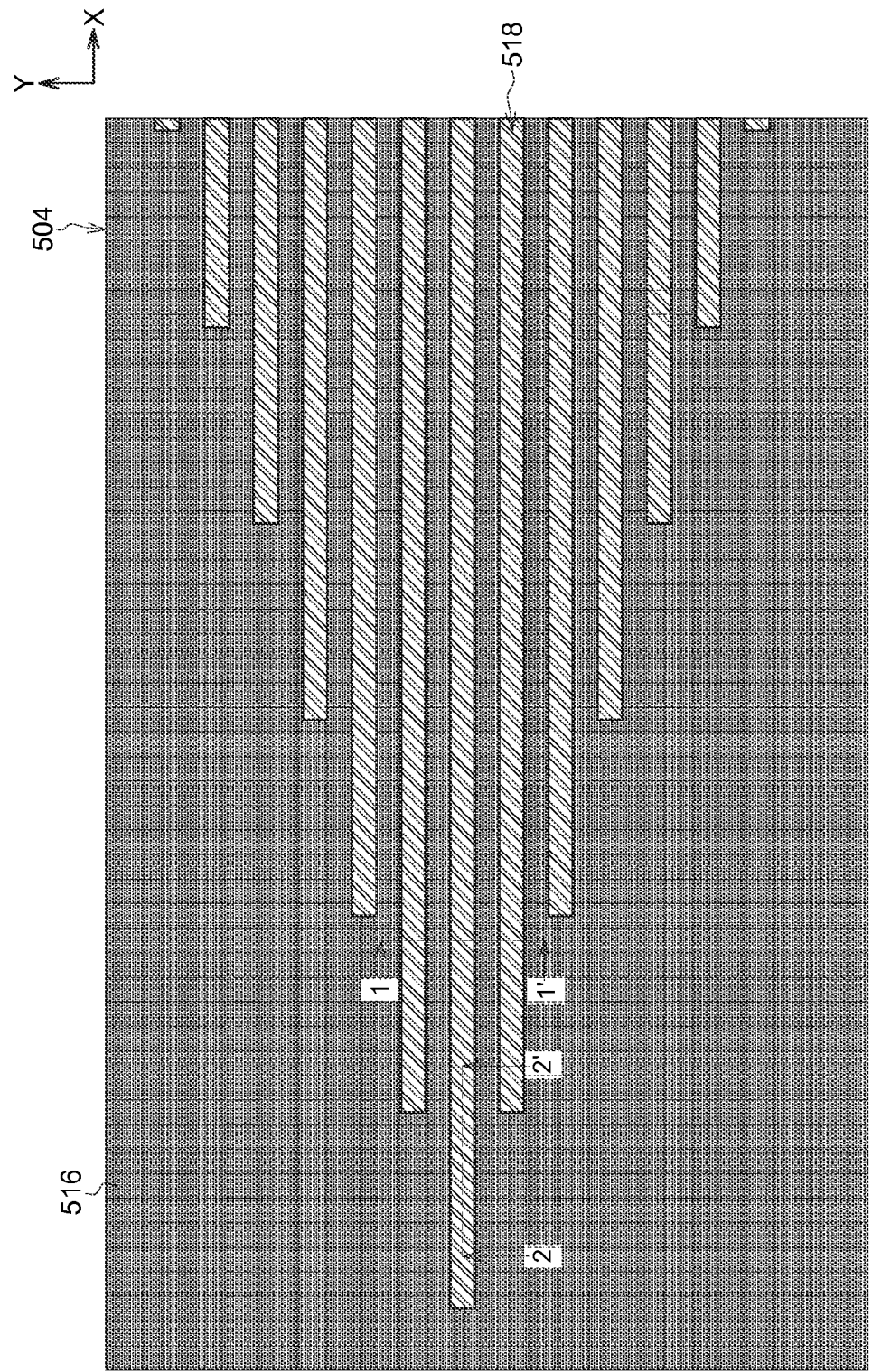

Referring to FIGS. 10A-10C, the cutting step comprises removing portions of the top portion 514A of the conductive material 514 and portions of the memory layers 512 on the stacks 504 along a direction perpendicular to an extending direction of the stacks 504. Cut trenches 518 are shown. In cases that the insulating material 516 covering the top portion 514A of the conductive material 514, the insulating material 516 in the cut trenches 518 are also removed. The cutting step may be carried out by lithography and etching processes. In this embodiment, the cut trenches 518 are formed along the holes H in a region substantially corresponding to the triangle-like in layout design of the holes H.

Figure 11A:
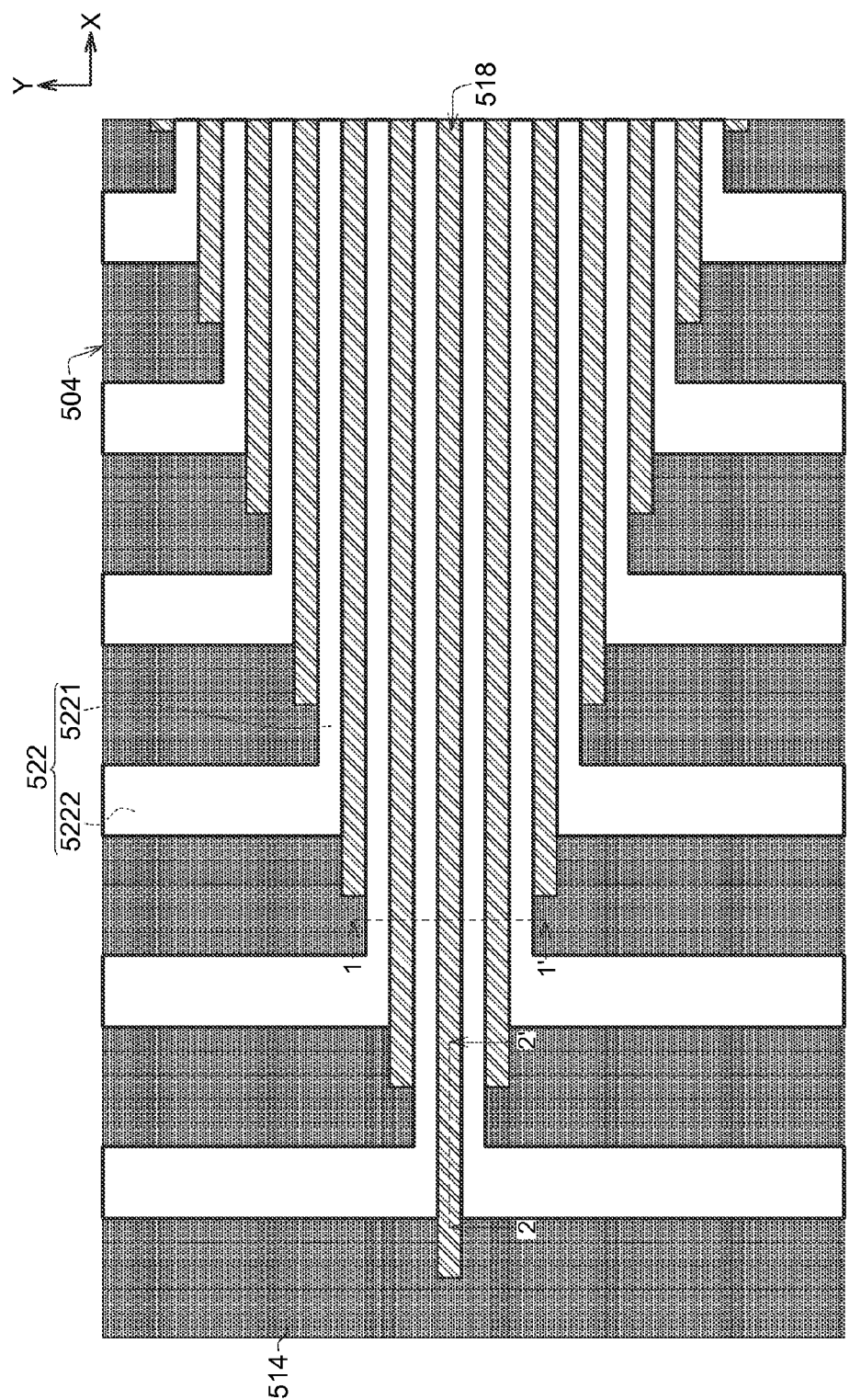

Referring to FIGS. 11A-11C, the defining step may be carried out again. The predetermined regions 522 are defined in the top portion 514A of the conductive material 514 for forming the conductive lines. Each of the predetermined regions 522 comprises a first predetermined region 5221 and a second predetermined region 5222 connected to each other, the first predetermined region 5221 extends along a direction perpendicular to the extending direction of the stacks 504, and the second predetermined region 5222 extends along the extending direction of the stacks 504. The removing step is carried out as shown in FIG. 11A-11C. The removing step comprises removing remained portions of the top portion 514A of the conductive material 514 that is not in the predetermined regions 522. Removed trenches 520 are shown. Similar to the cutting step, the removing step may be carried out by lithography and etching processes.

Figure 12A:
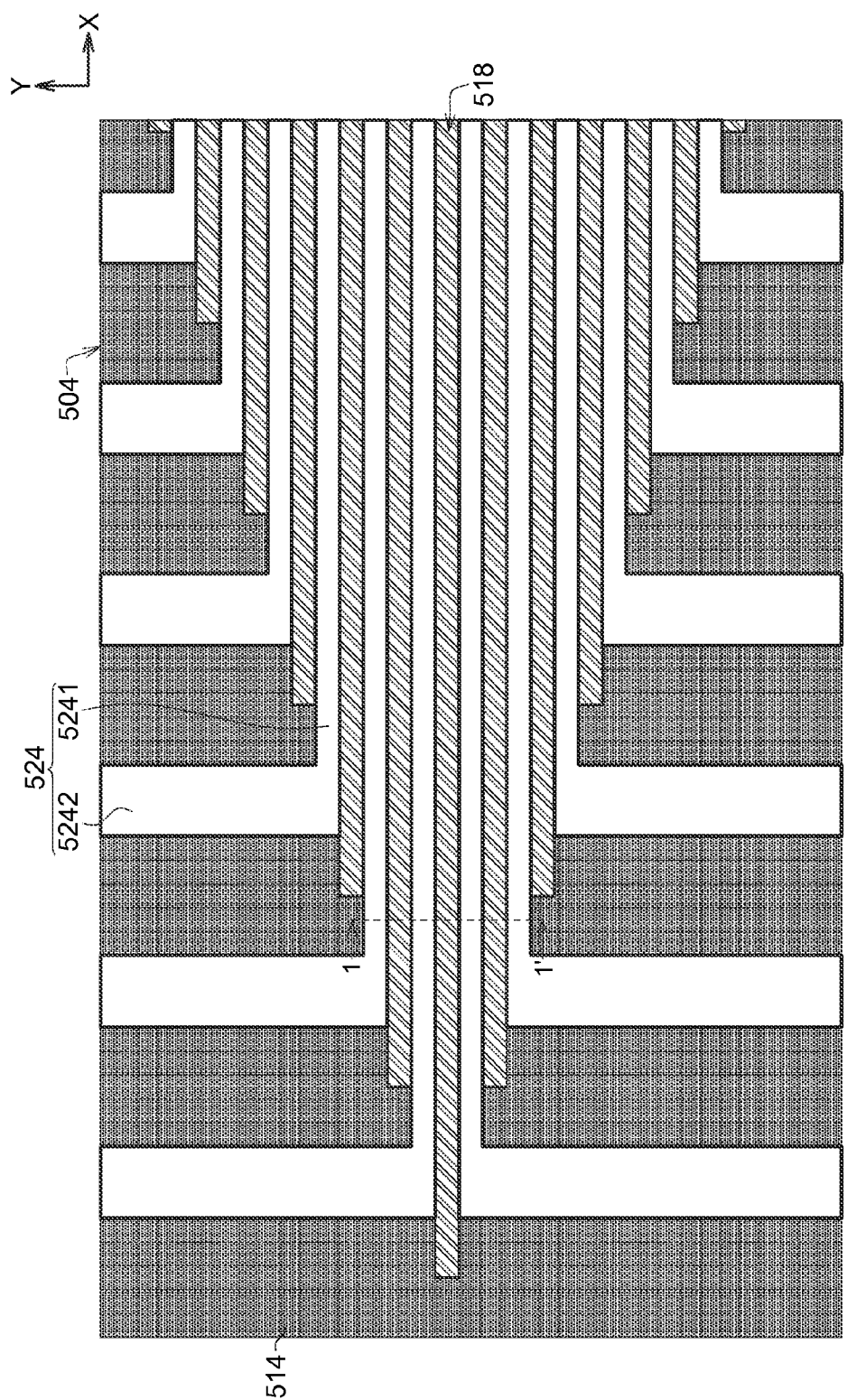
Figure 12B:
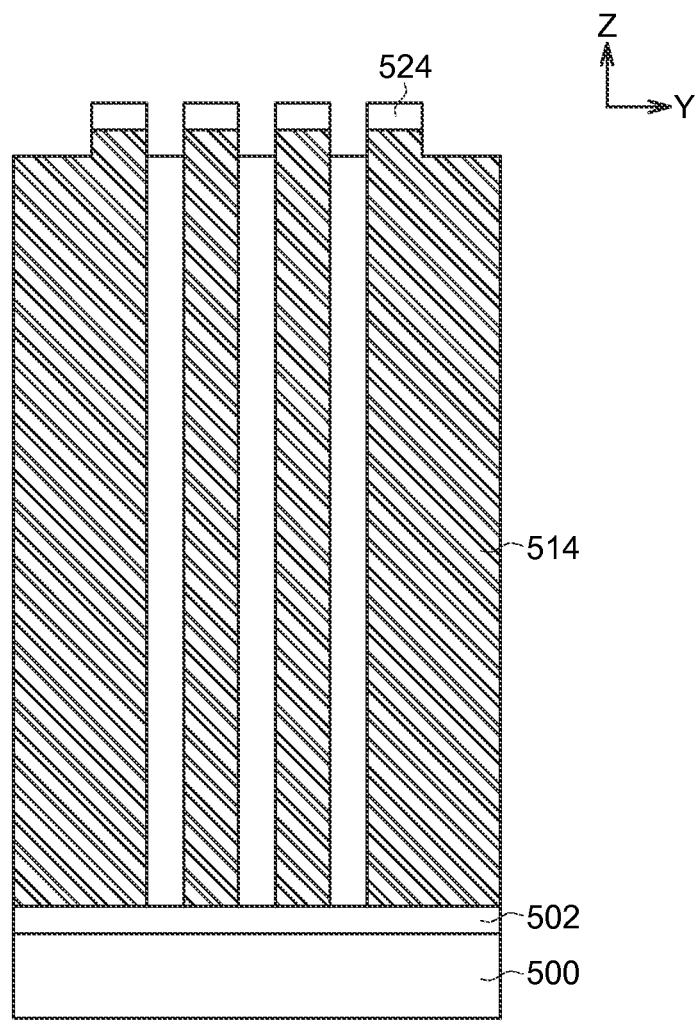

Referring to FIGS. 12A-12B, the conductive lines 524 are formed on the top portion 514A of the conductive material 514 remained in the predetermined regions 522. The conductive lines 524 may be formed of silicide. In one embodiment, the conductive lines 524 are formed by depositing a WSi layer on the top portion 514A of the conductive material 514 remained in the predetermined regions 522. In another embodiment, the conductive lines 524 are formed by depositing a metal, such as Co, Ni, Ti or the like, on the top portion 514A of the conductive material 514 remained in the predetermined regions 522 and making the metal to react with the conductive material 514 (polysilicon) to form a silicide, such as CoSi, NiSi, TiSi or the like. As shown in FIG. 12A, each of the conductive lines 524 comprises a first portion 5241 and a second portion 5242 connected to each other, the first portion 5241 extends along a direction perpendicular to the extending direction of the stacks 504, and the second portion 5242 extends along the extending direction of the stacks 504. Lengths of the first portions 5241 and the second portions 5242 of the conductive lines 524 may be sequentially increased.

The method describes above are compatible with the typical processes for manufacturing a semiconductor structure, such as a memory structure. For example, the concept of a process for patterning conductive material formed over the stacks comprising hole-line two-stage procedure is adapted. As such, the structure can be formed more regularly.

In cases of 3D vertical gate NAND memory, the conductive stripes 506 in the stacks 504 may be used as bit lines, and the conductive lines 524 may be used as word lines. While in cases of 3D vertical channel NAND memory, the conductive stripes 506 in the stacks 504 may be used as word lines, and the conductive lines 524 may be used as bit lines.

A memory structure manufactured by a method described above comprises a substrate 500, a plurality of stacks 504 (or 104/204/304/404), a plurality of memory layers 512, a conductive material 514 (or 114/214/314/414) and a plurality of conductive lines 524. The stacks 504 (or 104/204/304/404) are positioned on the substrate 500. The stacks 504 (or 104/

204/304/404) are separated from each other by a plurality of trenches T. Each of the stacks 504 (or 104/204/304/404) comprises alternately stacked conductive stripes 506 and insulating stripes 508. The memory layers 512 conformally cover the stacks 504 (or 104/204/304/404) respectively. The conductive material 514 (or 114/214/314/414) is positioned in the trenches T and on the stacks 504 (or 104/204/304/404). The conductive material 514 (or 114/214/314/414) in the trenches T forms one or more holes H in each of the trenches T. In one embodiment, the one or more holes H in each of the trenches T are arranged in a matrix, as shown in FIG. 1A. In another embodiment, the one or more holes H in each of the trenches T are arranged to constitute a triangle-like in layout design, as shown in FIGS. 2A, 3A and 4A.

The conductive lines 524 are positioned on the conductive material 514 (or 114/214/314/414). Each of the conductive lines 524 comprises a first portion 5241 and a second portion 5242 connected to each other, the first portion 5241 extends along a direction perpendicular to an extending direction of the stacks 504 (or 104/204/304/404), and the second portion 5242 extends along the extending direction of the stacks 504 (or 104/204/304/404). Lengths of the first portions 5241 and the second portions 5242 of the conductive lines 524 may be sequentially increased. The conductive lines 524 may be formed of silicide. In one embodiment, the conductive stripes 506 in the stacks 504 (or 104/204/304/404) are used as bit lines, and the conductive lines 524 are used as word lines. In another embodiment, the conductive stripes 506 in the stacks 504 (or 104/204/304/404) are used as word lines, and the conductive lines 524 are used as bit lines.

For simplify, other detailed structural features which have been described above with respect to the manufacturing method are omitted herein.

According to the embodiments, the fan-out portions of conductive lines (i.e. the first portions and the second portions of conductive lines) are formed on the dummy stacks, i.e. the stacks in an extending area of the array region. As such, the conductive lines are all formed in a relative regular region, and the failure rate can be decreased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for manufacturing a memory structure, comprising:
    forming a plurality of stacks on a substrate, wherein the stacks are separated from each other by a plurality of trenches, and each of the stacks comprises alternately stacked conductive stripes and insulating stripes;
    forming a plurality of memory layers conformally covering the stacks respectively;
    forming a conductive material in the trenches and on the stacks, the conductive material having a top portion;
    forming one or more holes in the conductive material in each of the trenches; and
    defining a plurality of predetermined regions for respectively forming a plurality of conductive lines in the top portion of the conductive material, wherein each of the predetermined regions comprises a first predetermined region and a second predetermined region connected to each other, the first predetermined region extends along a direction perpendicular to an extending direction of the stacks, and the second predetermined region extends along the extending direction of the stacks.

2. The method according to claim 1, wherein the one or more holes in each of the trenches are arranged in a matrix, or arranged to constitute a triangle-like in layout design.

3. The method according to claim 1, wherein said defining the predetermined regions is carried out before said forming the one or more holes.

4. The method according to claim 1, wherein said defining the predetermined regions is carried out after said forming the one or more holes.

5. The method according to claim 1, wherein lengths of the first predetermined regions and the second predetermined regions are sequentially increased.

6. The method according to claim 1, further comprises:
    removing the top portion of the conductive material that is not in the predetermined regions; and
    forming the conductive lines on the top portion of the conductive material remained in the predetermined regions.

7. The method according to claim 6, further comprises:
    before said removing the top portion of the conductive material that is not in the predetermined regions, filling an insulating material into the one or more holes in each of the trenches.

8. The method according to claim 7, wherein said removing the top portion of the conductive material that is not in the predetermined regions comprises a cutting step and a removing step, the cutting step comprises removing portions of the top portion of conductive material and portions of the memory layers on the stacks along the direction perpendicular to the extending direction of the stacks, and the removing step comprises removing remained portions of the top portion of conductive material that is not in the predetermined regions.

9. The method according to claim 6, wherein the first predetermined regions of adjacent two of the predetermined regions are connected to each other by an extending portion of the second predetermined region of one of the adjacent two of the predetermined regions, and the top portion of the conductive material in the extending portion is removed by a cutting step.

10. The method according to claim 6, wherein the first predetermined regions of adjacent two of the predetermined regions are connected to each other by an extending portion of the second predetermined region of one of the adjacent two of the predetermined regions and an extending portion of the second predetermined region of another one of the predetermined regions, and the top portion of the conductive material in the extending portion of the second predetermined region of one of the adjacent two of the predetermined regions and in the extending portion of the second predetermined region of the another one of the predetermined regions is removed by a cutting step.

11. The method according to claim 1, wherein the conductive lines are formed of silicide.

12. The method according to claim 1, wherein the conductive stripes in the stacks are used as bit lines, and the conductive lines are used as word lines.

13. The method according to claim 1, wherein the conductive stripes in the stacks are used as word lines, and the conductive lines are used as bit lines.

14. A memory structure, comprising:
    a substrate;
    a plurality of stacks positioned on the substrate, wherein the stacks are separated from each other by a plurality of trenches, and each of the stacks comprises alternately stacked conductive stripes and insulating stripes;

a plurality of memory layers conformally covering the stacks respectively;

a conductive material positioned in the trenches and on the stacks, wherein the conductive material in the trenches forms one or more holes in each of the trenches; and a plurality of conductive lines positioned on the conductive material, wherein each of the conductive lines comprises a first portion and a second portion connected to each other, the first portion extends along a direction perpendicular to an extending direction of the stacks, and the second portion extends along the extending direction of the stacks.

15. The memory structure according to claim 14, wherein the one or more holes in each of the trenches are arranged in a matrix.

16. The memory structure according to claim 14, wherein the one or more holes in each of the trenches are arranged to constitute a triangle-like in layout design.

17. The memory structure according to claim 14, wherein lengths of the first portions and the second portions of the conductive lines are sequentially increased.

18. The memory structure according to claim 14, wherein the conductive lines are formed of silicide.

19. The memory structure according to claim 14, wherein the conductive stripes in the stacks are used as bit lines, and the conductive lines are used as word lines.

20. The memory structure according to claim 14, wherein the conductive stripes in the stacks are used as word lines, and the conductive lines are used as bit lines.

* * * * *